(12) United States Patent
Miyamoto

(10) Patent No.: US 11,232,972 B2
(45) Date of Patent: Jan. 25, 2022

(54) SUBSTRATE HOLDER, PLATING DEVICE, AND PLATING METHOD OF SUBSTRATE

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/680,451

(22) Filed: Nov. 11, 2019

(65) Prior Publication Data
US 2020/0161164 A1 May 21, 2020

(30) Foreign Application Priority Data

Nov. 15, 2018 (JP) .............................. JP2018-214402

(51) Int. Cl.
*H01L 21/687* (2006.01)
*C25D 17/06* (2006.01)
*C25D 17/00* (2006.01)

(52) U.S. Cl.
CPC ...... *H01L 21/68721* (2013.01); *C25D 17/001* (2013.01); *C25D 17/06* (2013.01)

(58) Field of Classification Search
CPC .............. H01L 21/68721; C25D 17/06; C25D 7/12–123; C25D 17/001
See application file for complete search history.

(56) References Cited

U.S. PATENT DOCUMENTS

2006/0108231 A1* 5/2006 Weichart ................ C25D 17/12
205/165
2006/0274474 A1* 12/2006 Lee ......................... C23C 14/50
361/143

FOREIGN PATENT DOCUMENTS

| JP | 2004277815 | | 10/2004 |
| JP | 2015193935 | A * | 11/2015 |
| JP | 2018040045 | | 3/2018 |

OTHER PUBLICATIONS

Fujikata et al., Machine Translation, JP 2015-193935 A (Year: 2015).*

\* cited by examiner

*Primary Examiner* — Ho-Sung Chung
(74) *Attorney, Agent, or Firm* — JCIPRNET

(57) ABSTRACT

A substrate holder capable of being used in both single-side plating and double-side plating is required. Disclosed is a substrate holder for holding a substrate to be plated. The substrate holder includes a first frame having a first opening for exposing one surface of the substrate and a second frame having a second opening for exposing the other surface of the substrate, and the substrate is sandwiched between the first frame and the second frame. The substrate holder further includes a dummy substrate which is detachably disposed between the first frame and the substrate and formed of a material that at least direct current does not substantially flow therein. At least a part of the dummy substrate is in contact with at least a part of the one surface of the substrate, and the dummy substrate protects the one surface of the substrate from a plating solution.

15 Claims, 21 Drawing Sheets

SUBSTRATE HOLDER, PLATING DEVICE, AND PLATING METHOD OF SUBSTRATE

CROSS REFERENCE TO RELATED APPLICATIONS

This application claims the priority benefit of Japanese Patent Application No. 2018-214402, filed on Nov. 15, 2018. The entirety of the above-mentioned patent application is hereby incorporated by reference herein and made a part of this specification.

BACKGROUND OF THE DISCLOSURE

Technical Field

The disclosure relates to a substrate holder, a plating device, and a plating method of substrate.

Related Art

In a plating device for plating a substrate such as a silicon wafer or the like, a substrate holder for holding the substrate is used. Known art may be found in Patent document 1 (Japanese Patent Application Laid-Open No. 2018-40045) and Patent document 2 (Japanese Patent Application Laid-Open No. 2004-277815).

SUMMARY

Plating processing can be generally divided into single-side plating for plating only one surface of a substrate and double-side plating for plating both surfaces of the substrate. In recent years, a substrate holder that can be used in both the single-side plating and the double-side plating is required.

In one embodiment, the disclosure provides a substrate holder for holding a substrate to be plated. The substrate holder includes a first frame having a first opening for exposing one surface of a substrate and a second frame having a second opening for exposing the other surface of the substrate, and the substrate is sandwiched between the first frame and the second frame. The substrate holder further includes a dummy substrate detachably disposed between the first frame and the substrate and formed of a material that at least a direct current does not substantially flow therein. At least a part of the dummy substrate is in contact with at least a part of the one surface of the substrate, and the dummy substrate protects the one surface of the substrate from a plating solution.

DESCRIPTION OF THE EMBODIMENTS

Figure 1A:
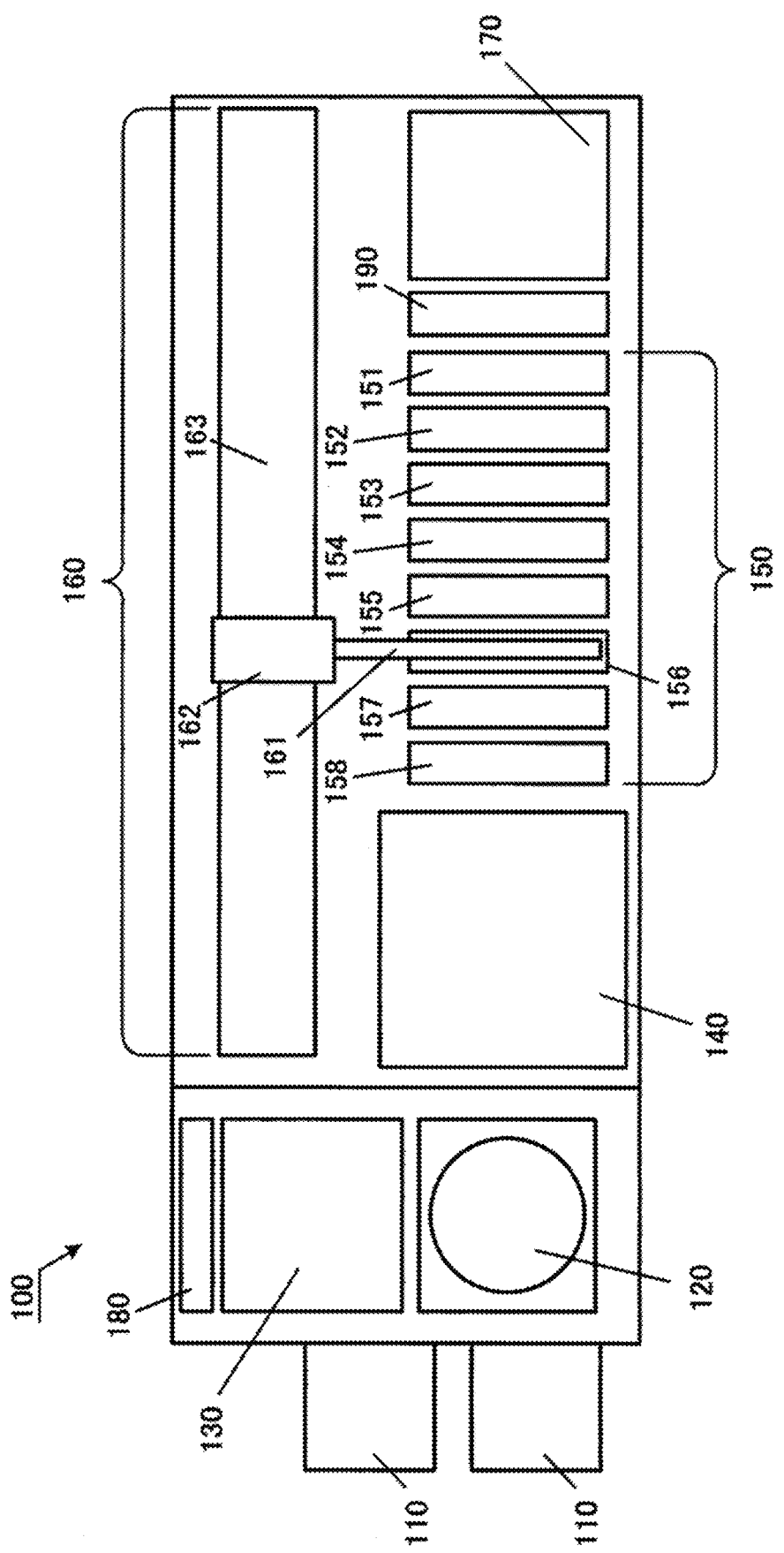
FIG. 1A is a top view of a plating device.
Figure 1B:
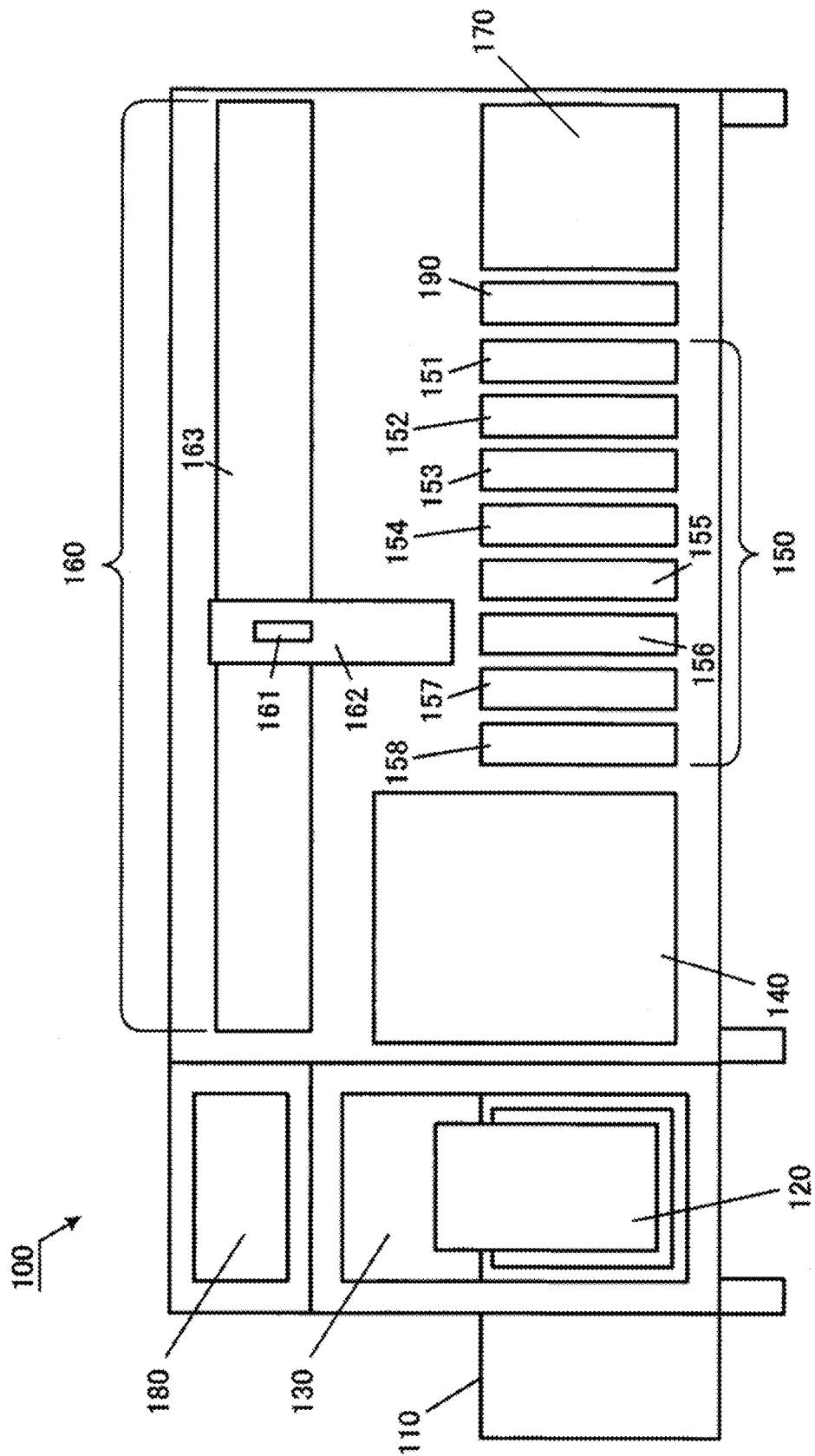
FIG. 1B is a side view of the plating device.

<Plating Device>
FIG. 1 is a schematic diagram of a plating device 100 of an embodiment. FIG. 1A is a top view of the plating device 100. FIG. 1B is a side view of the plating device 100. The plating device 100 of the embodiment includes a load port 110, a substrate transfer robot 120, a dryer 130, a substrate attachment and detachment device 140, a plating treatment portion 150, a transporter 160, and a stocker 170. Furthermore, the plating device 100 may include a control portion 180 for controlling each portion of the plating device 100. Besides, in the description below, the substrate to be plated is in a square shape. However, a substrate having a shape other than the square shape may also be used.

The load port 110 is arranged to load a substrate to the plating device 100 and unload the substrate from the device 100. The load port 110 may be configured to be capable of mounting a mechanism such as a FOUP (Front Opening Universal Pod) or capable of transferring the substrate between the load port 110 and a mechanism such as a FOUP. The substrate loaded by the load port 110 is transferred to the substrate attachment and detachment device 140 by the substrate transfer robot 120.

The substrate attachment and detachment device 140 is a device for attaching the substrate to a substrate holder or detaching the substrate from the substrate holder. It is necessary to transfer both the substrate and the substrate holder into the substrate attachment and detachment device 140. Therefore, the substrate attachment and detachment device 140 is located at a position that is accessible by both the substrate transfer robot 120 and the transporter 160.

The plating treatment portion 150 is arranged to perform plating on the substrate. The plating treatment portion 150 includes one treatment tank or a plurality of treatment tanks. At least one of the one treatment tank or the plurality of treatment tanks is a plating tank. As an example, the treatment portion 150 of FIGS. 1A-1B includes eight treatment tanks, that is, a pre-water washing tank 151, a pretreatment tank 152, a first rinse tank 153, a first plating tank 154, a second rinse tank 155, a second plating tank 156, a third rinse tank 157 and a blow tank 158. The plating device 100 can perform predetermined treatments in order in each treatment tank.

The transporter 160 is configured to transport the substrate holder between the substrate attachment and detachment device 140, the plating treatment portion 150, and the stocker 170. The transporter 160 includes a transporter arm 161 for suspending the substrate holder, an arm vertical movement mechanism 162 for vertically moving the transporter arm 161, and a horizontal movement mechanism 163 for horizontally moving the arm vertical movement mechanism 162 along the arrangement of the treatment tanks. It should be noted that the configuration of the transporter 160 is only an example.

The stocker 170 is configured to be capable of storing at least one substrate holder, or a plurality of substrate holders. By the transporter 160, the substrate holder not holding a substrate is transported from the stocker 170 to the substrate attachment and detachment device 140. The substrate holder transferred into the substrate attachment and detachment device 140 holds the substrate which is transported into the substrate attachment and detachment device 140 by the substrate transfer robot 120. When the plating is completed, the substrate holder holding the substrate is transported into the substrate attachment and detachment device 140. After that, the substrate attachment and detachment device 140 detaches the substrate from the substrate holder. At least one substrate holder 200 including a dummy substrate 900 (described later) and at least one substrate holder from which the dummy substrate 900 is detached are accommodated in the stocker 170. Furthermore, when the substrate holder 200 includes a clamper 290SL (described later), the substrate holder 200 may be accommodated in the stocker 170 in a semi-locking state.

Furthermore, the plating device 100 may optionally include a holder/dummy substrate cleaning portion 190 for cleaning the substrate holder 200 and/or the dummy substrate 900 described later. Details of the holder/dummy substrate cleaning portion 190 are described later.

<Substrate Holder>

Figure 2A:
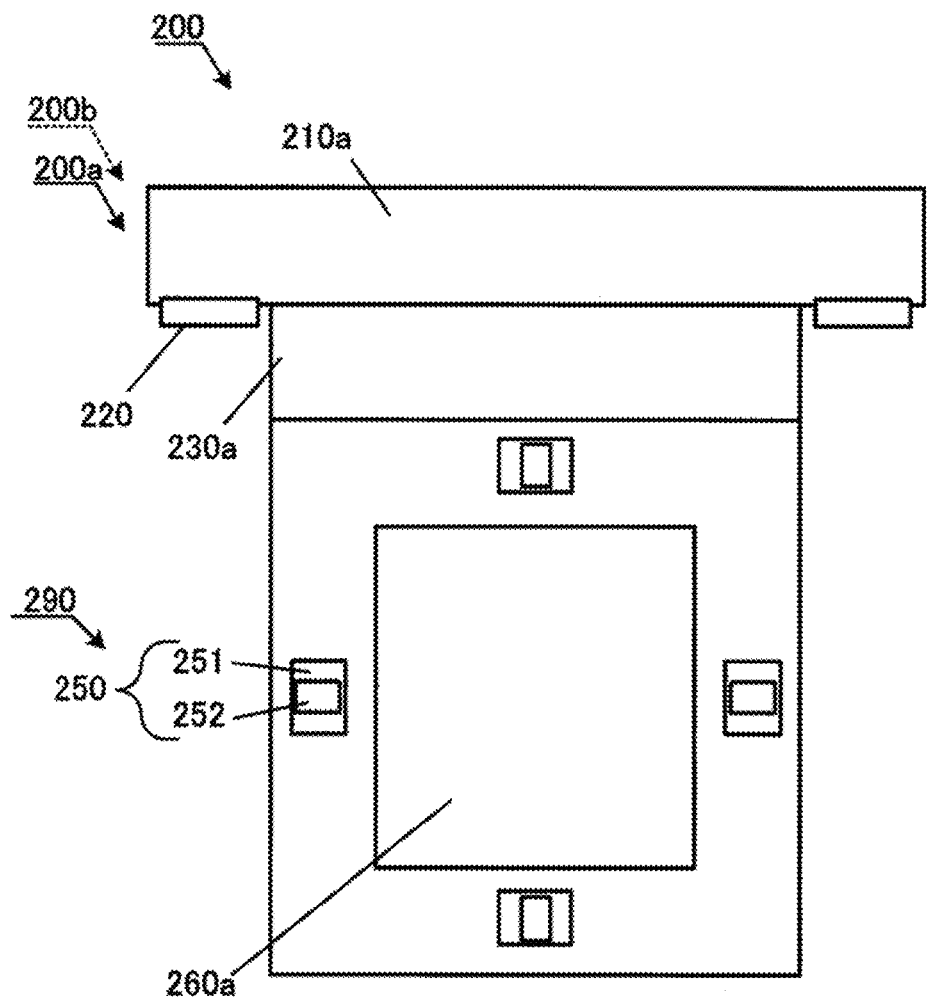
FIG. 2A is a front view of a substrate holder.
Figure 2B:
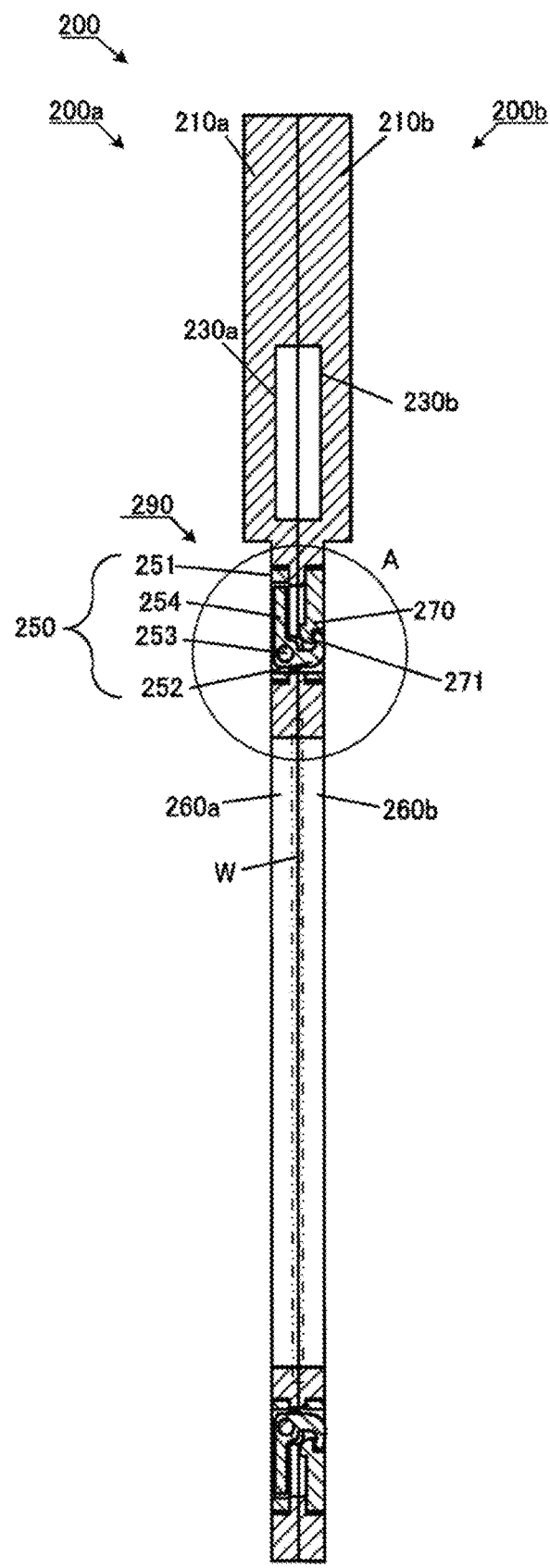
FIG. 2B is a cross-sectional view of the substrate holder.
Figure 2C:
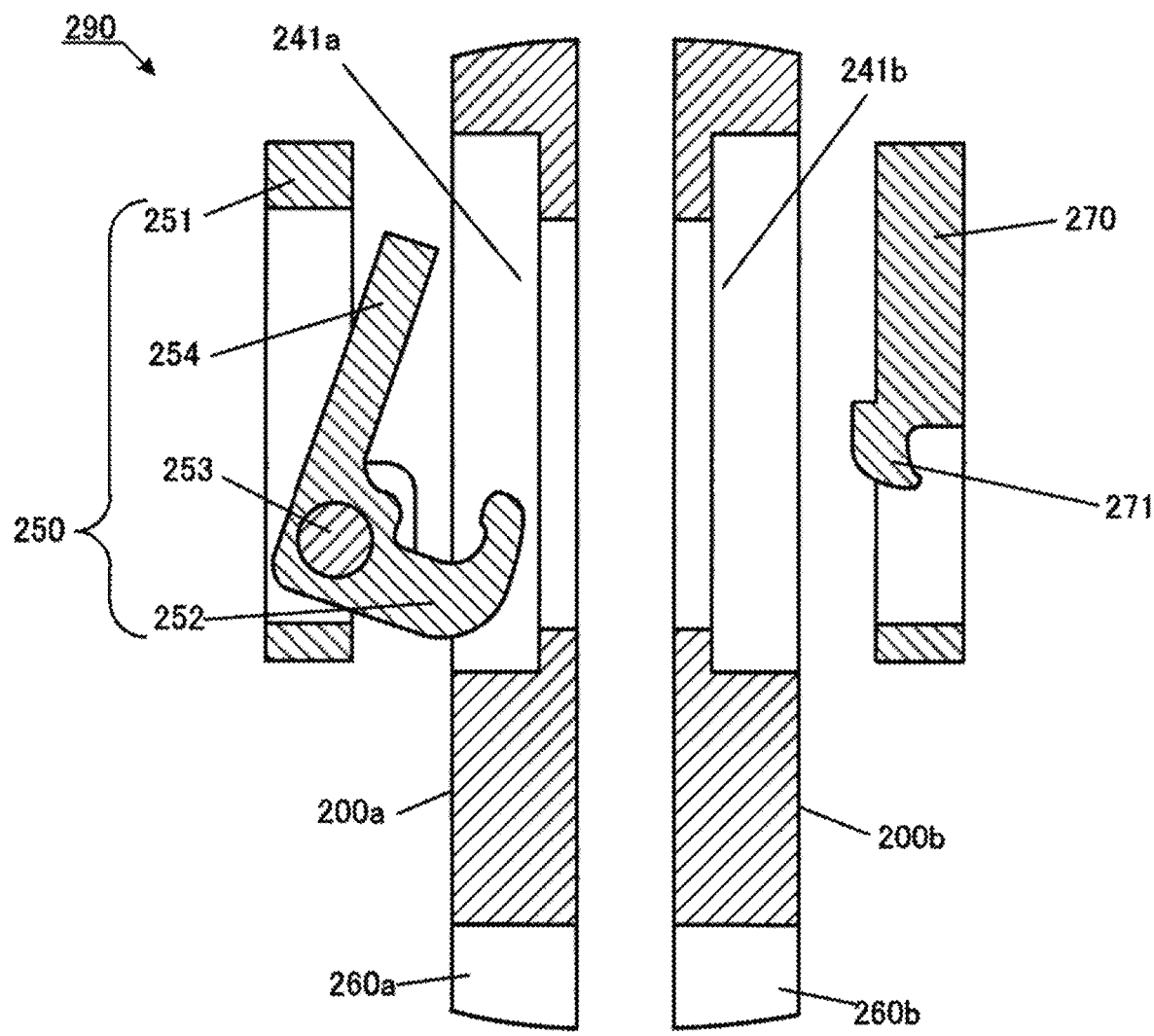
FIG. 2C is an enlarged exploded view of a section marked with "A" in FIG. 2B.

Next, the substrate holder (added with a symbol "200" hereinafter) used in the plating device 100 is described. FIGS. 2A-2C are schematic diagrams of the substrate holder 200. FIG. 2A is a front view of the substrate holder 200. FIG. 2B is a cross-sectional view of the substrate holder 200. FIG. 2C is an enlarged exploded view of a section marked by "A" in FIG. 2B.

The substrate holder 200 is a member for holding the substrate by sandwiching the substrate between frames. The substrate holder 200 includes a front frame 200a and a rear frame 200b for holding the substrate. It should be noted that the terms "front" and "rear" are for convenience only, and either the side on which the front frame 200a is located or the side on which the rear frame 200b is located may be referred to as a front surface. The front frame 200a and the rear frame 200b are clamped by at least one clamper 290, or may be clamped by a plurality of clampers 290 (details of the clamper 290 are described later). The substrate (added with a symbol "W" hereinafter) is shown by an imaginary line in FIG. 2B.

The front frame 200a has a holder arm 210a. A shoulder electrode 220 may be arranged on the shoulder of the holder arm 210a. In the example of FIGS. 2A-2C, two shoulder electrodes 220 are arranged on both shoulders of the holder arm 210a. The shoulder electrodes 220 are electrically connected to substrate electrodes 320 described later by an unillustrated conductive path (wiring, bus bar or the like). The substrate electrodes 320 are electrically connected to the substrate W, and thus the shoulder electrodes 220 are electrically connected to the substrate W. A holder arm 210b is arranged on the rear frame 200b. The configuration of the holder arm 210b is the same as the configuration of the holder arm 210a. The front frame 200a may include a wiring storage portion 230a. The rear frame 200b may include a wiring storage portion 230b.

In the respective central parts of the front frame 200a and the rear frame 200b, an opening 260a and an opening 260b for exposing the substrate W are respectively formed. In the example of FIGS. 2A-2C, the opening 260a and the opening 260b have a square shape. The shapes of the opening 260a and the opening 260b may also be appropriately changed if necessary.

When the substrate holder 200 holds the substrate W only, one surface of the substrate W is exposed to the outside via the opening 260a, and the other surface of the substrate W is exposed to the outside via the opening 260b. Accordingly, the substrate holder 200 can be used for double-side plating. On the other hand, when the substrate holder 200 holds both the substrate W and the dummy substrate 900 described later (see FIG. 9), only one surface of the substrate W is exposed. Accordingly, the substrate holder 200 of an embodiment can be used for not only double-side plating but also single-side plating.

<Clamper>

The substrate holder 200 includes one clamper 290 or a plurality of clampers 290. The clamper 290 has a hook portion 250 attached to the front frame 200a and a plate 270 attached to the rear frame 200b. Alternatively, the hook portion 250 may be attached to the rear frame 200b, and the plate 270 may be attached to the front frame 200a. In the example of FIGS. 2A-2C, totally, four clampers 290 are arranged around the opening 260a and the opening 260b.

The hook portion 250 includes a hook base 251 attached to the front frame 200a, a hook body 252, and a shaft 253 which pivotally supports the hook body 252 with respect to the hook base 251. The hook portion 250 may further include a lever 254 for making the hook body 252 pivot about the shaft 253. The hook body 252 extends toward the rear frame 200b. The shaft 253 expands within a plane parallel to the surface of the substrate W to be held. The hook portion 250 may further include a pressing member, which is a pressing member (not shown) for maintaining the hooking between the hook body 252 and a claw 271 (described later) and which energizes the hook body 252 to a counterclockwise direction of FIG. 2B or FIG. 2C about the shaft 253. The pressing member may be, for example, a torsion spring.

A port 241a (see FIG. 2C) is arranged on the front frame 200a. The hook portion 250 is attached to the port 241a. A port 241b (see FIG. 2C) is arranged on the rear frame 200b. The position and the number of the port 241b correspond to the position and the number of the port 241a. The plate 270 is attached to the port 241b. The claw 271 to which the hook body 252 is hooked is arranged on the plate 270. The claw 271 extends toward the front frame 200a.

In the embodiment shown in FIGS. 2A-2C, the hooking between the hook body 252 and the claw 271 is released by pressing the lever 254 toward the rear frame 200b. Instead, the lever 254 and the like may be configured so that the hooking is released by pulling the lever 254.

<Details of Substrate Holding Portion>

Figure 3:
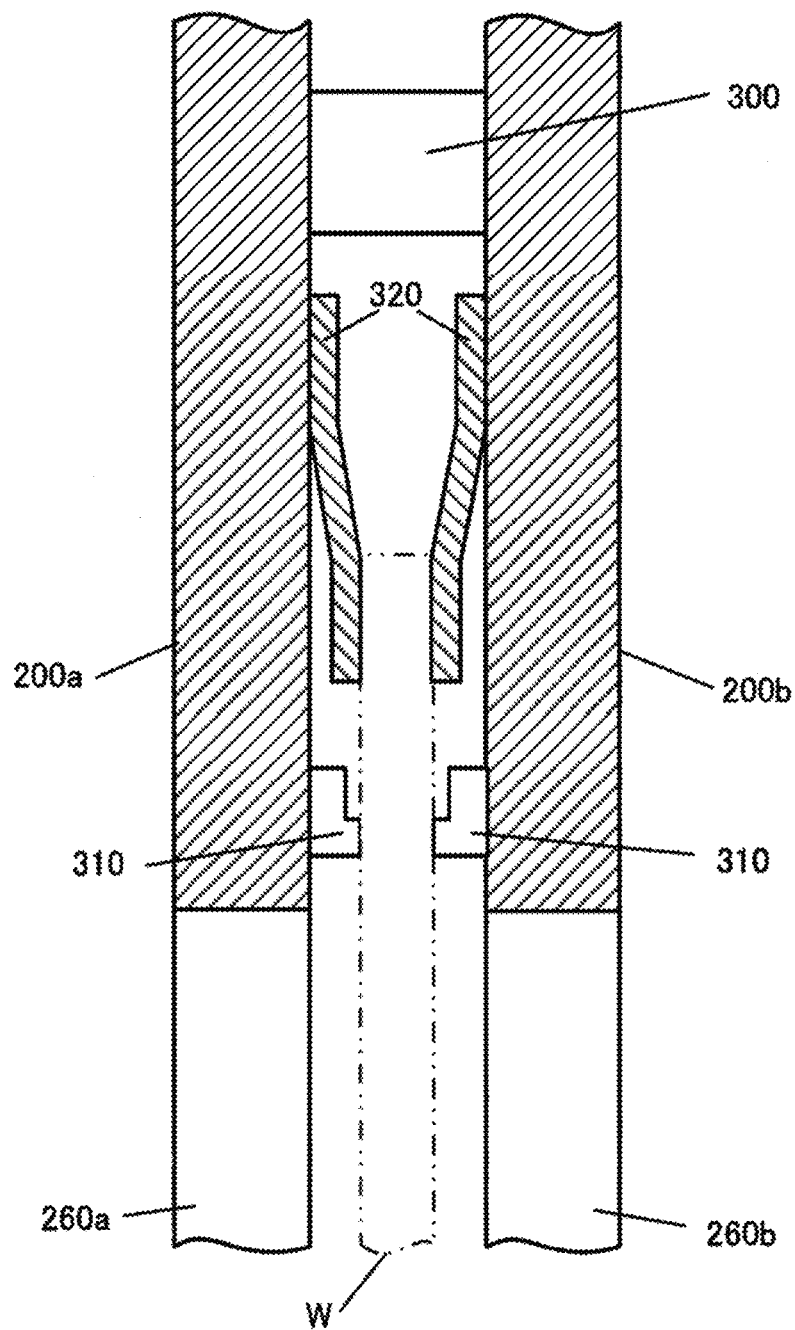
FIG. 3 is a cross-sectional view of a part of the substrate holder holding a substrate.

Next, FIG. 3 is used to describe details of a part of the substrate holder 200 holding the substrate W. The substrate electrodes 320 are respectively arranged on the front frame 200a and the rear frame 200b of FIG. 3. Each of the substrate electrodes 320 is electrically connected to each surface of the substrate W. Because the substrate electrodes 320 are electrically connected to the shoulder electrodes 220, the shoulder electrodes 220 are electrically connected to the respective surfaces of the substrate W.

The substrate holder 200 includes an outer seal 300 and inner seals 310 for sealing a space where the substrate electrodes 320 exist from a plating solution. The outer seal 300 is in contact with the front frame 200a and the rear frame 200b. The outer seal 300 is configured to seal a gap between the front frame 200a and the rear frame 200b at the outside of the substrate W. The outer seal 300 may be arranged on the front frame 200a or be arranged on the rear frame 200b. The inner seals 310 are respectively arranged on the front frame 200a and the rear frame 200b. The inner seals 310 are in contact with the substrate W. However, when the dummy substrate 900 described later is attached to the substrate holder 200, one of the inner seals 310 is in contact with the dummy substrate 900. The outer seal 300 and the inner seals 310 can elastically deform in the thickness direction of the substrate W. The substrate W is held between the front frame 200a and the rear frame 200b by a contact pressure between the inner seals 310 and the substrate W.

<Clamper Having Semi-Locking Function>

The substrate holder 200 may include a clamper having a "semi-locking function". The semi-locking function refers to "a function for holding the front frame 200a and the rear frame 200b in a state that the front frame 200a and the rear frame 200b are spaced apart". Basically, the semi-locking function is a function for combining the front frame 200a and the rear frame 200b of the substrate holder not holding a substrate. In the semi-locking state, the seals and contact points of the front frame 200a and the rear frame 200b are not in contact with each other. The semi-locking of the substrate holder 200 is advantageous in terms of component life, transport easiness of the substrate holder, cleaning easiness of the substrate holder, and the like.

Figure 4:
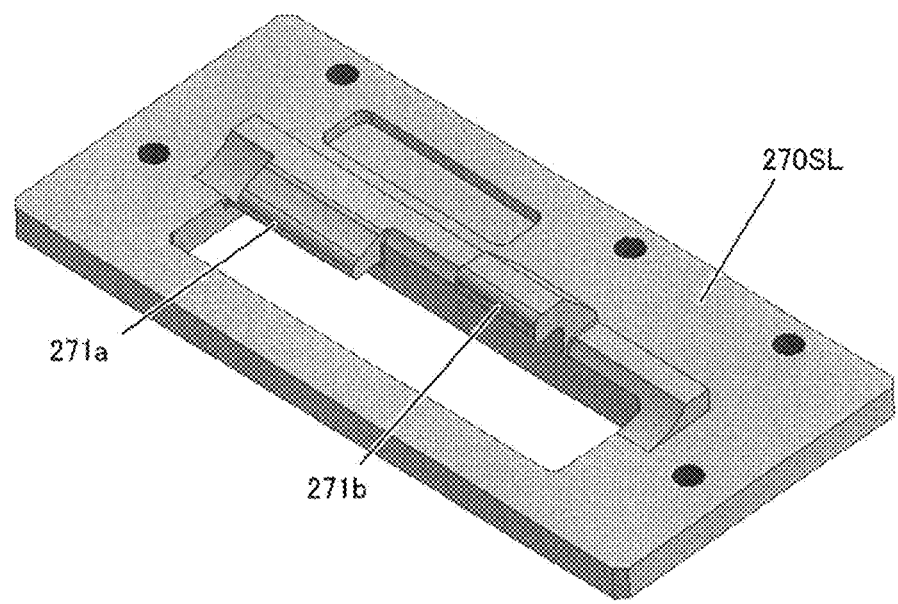
FIG. 4 is a perspective view of a plate of a clamper having a semi-locking function.
Figure 5:
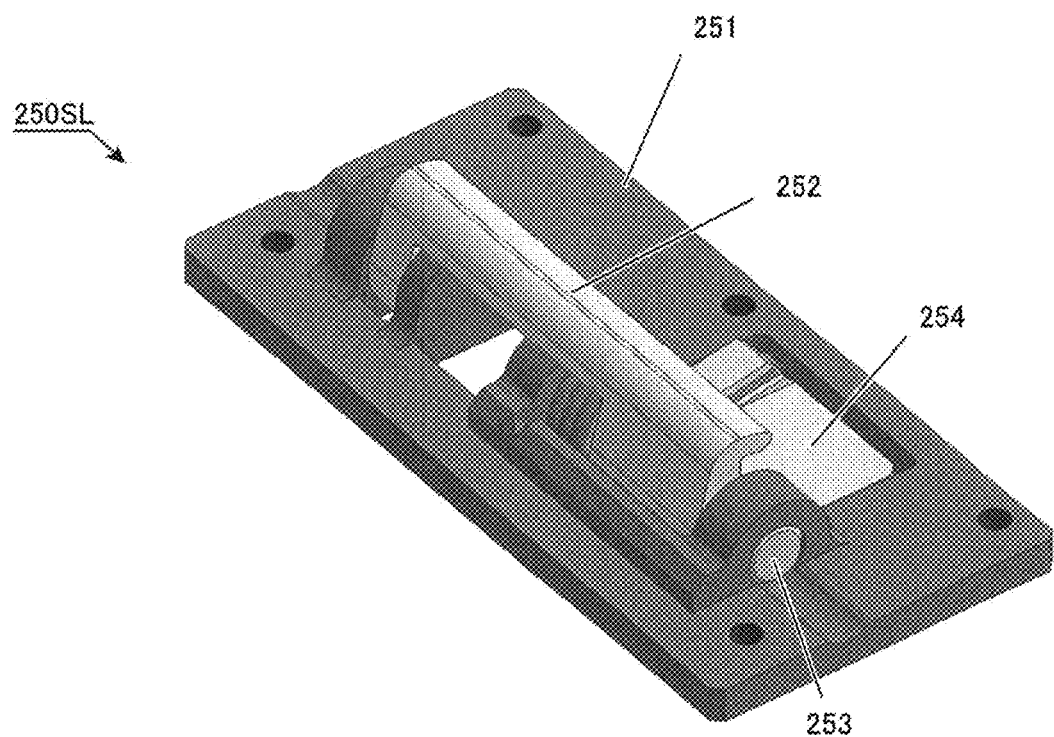
FIG. 5 is a perspective view of a hook portion paired with the plate of FIG. 4.
Figure 6:
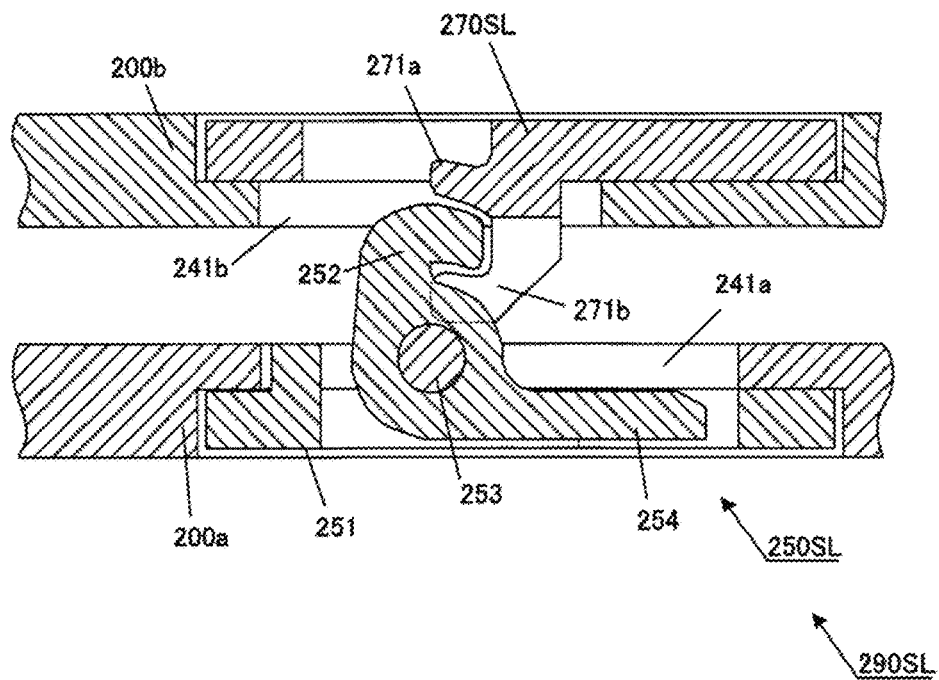
FIG. 6 is a cross-sectional view of a clamper including the plate of FIG. 4 and the hook portion of FIG. 5.

FIG. 4 is a perspective view of a plate of the clamper 290 having the semi-locking function. In the following, the plate shown in FIG. 4 is referred to as a "plate 270SL". "SL" is the initial of "Semi-Lock". FIG. 5 is a perspective view of a hook portion paired with the plate 270SL of FIG. 4. In the following, the hook portion shown in FIG. 5 is referred to as a "hook portion 250SL". FIG. 6 is a cross-sectional view of a clamper 290SL including the plate 270SL and the hook portion 250SL.

The plate 270SL has two claws 271. Specifically, the plate 270SL has a locking claw 271a and a semi-locking claw 271b. The locking claw 271a is configured so that the substrate holder 200 can hold the substrate W when the hook body 252 is hooked to the locking claw 271a. The semi-locking claw 271b is configured so that a distance between the front frame 200a and the rear frame 200b when the hook body 252 is hooked to the semi-locking claw 271b is larger than the distance between the front frame 200a and the rear frame 200b when the hook body 252 is hooked to the locking claw 271a.

The hook portion 250SL includes the hook body 252 which is extended in a longitudinal direction of the shaft 253. Along with the extension of the hook body 252, the hook body 252 is supported by two shafts 253. However, in FIG. 5, one of the shafts 253 is hidden in other components and is not shown. The respectively shafts 253 are disposed coaxially. One extended shaft 253 can also be used instead of two shafts 253.

The extended hook body 252 is selectively hooked to the locking claw 271a and the semi-locking claw 271b. The clamper 290 is locked when the hook body 252 is hooked to the locking claw 271a. The clamper 290 is semi-locked (also referred to as "the substrate holder 200 is semi-locked") when the hook body 252 is hooked to the semi-locking claw 271b. When the substrate holder 200 is semi-locked, the outer seal 300 and the inner seals 310 are not substantially compressed.

Besides, as long as there is no contradiction, in the following, the "clamper 290" may include the "clamper 290SL", the "plate 270" may include the "plate 270SL", and the "hook portion 250" may include the "hook portion 250SL".

<Substrate Attachment and Detachment Device>

In order to sandwich the substrate W between the front frame 200a and the rear frame 200b, it is necessary to hook the hook body 252 to the claw 271 (the locking claw 271a when the clamper 290SL is used). When the hook body 252 is hooked to the claw 271, the front frame 200a and the rear frame 200b are restrained from being separated from each other, and the outer seal 300 and the inner seals 310 elastically deform in the thickness direction of the substrate W and a seal pressure is generated. In order to hook the hook body 252 to the claw 271, it is necessary to temporarily locate the hook body 252 closer to the rear side (in the right direction of FIG. 2C) than the claw 271. Accordingly, in order to hold the substrate W by the substrate holder 200, it is necessary to press the front frame 200a toward the rear frame 200b or press the rear frame 200b toward the front frame 200a.

As described above, the outer seal 300 and the inner seals 310 exist between the front frame 200a and the rear frame 200b. Accordingly, when the front frame 200a and/or the rear frame 200b are/is pushed, a reaction force from the outer seal 300 and the inner seals 310 is generated. The substrate attachment and detachment device 140 of an embodiment is configured to be capable of pushing the front frame 200a and/or the rear frame 200b against the reaction force from the outer seal 300 and the inner seals 310. The substrate attachment and detachment device 140 is further configured to be capable of hooking the hook body 252 to the claw 271 (pivoting the hook body 252) in a state that the front frame 200a and/or the rear frame 200b are/is pushed. The substrate attachment and detachment device 140 can attach the substrate W to the substrate holder 200 by these operations.

Figure 7A:
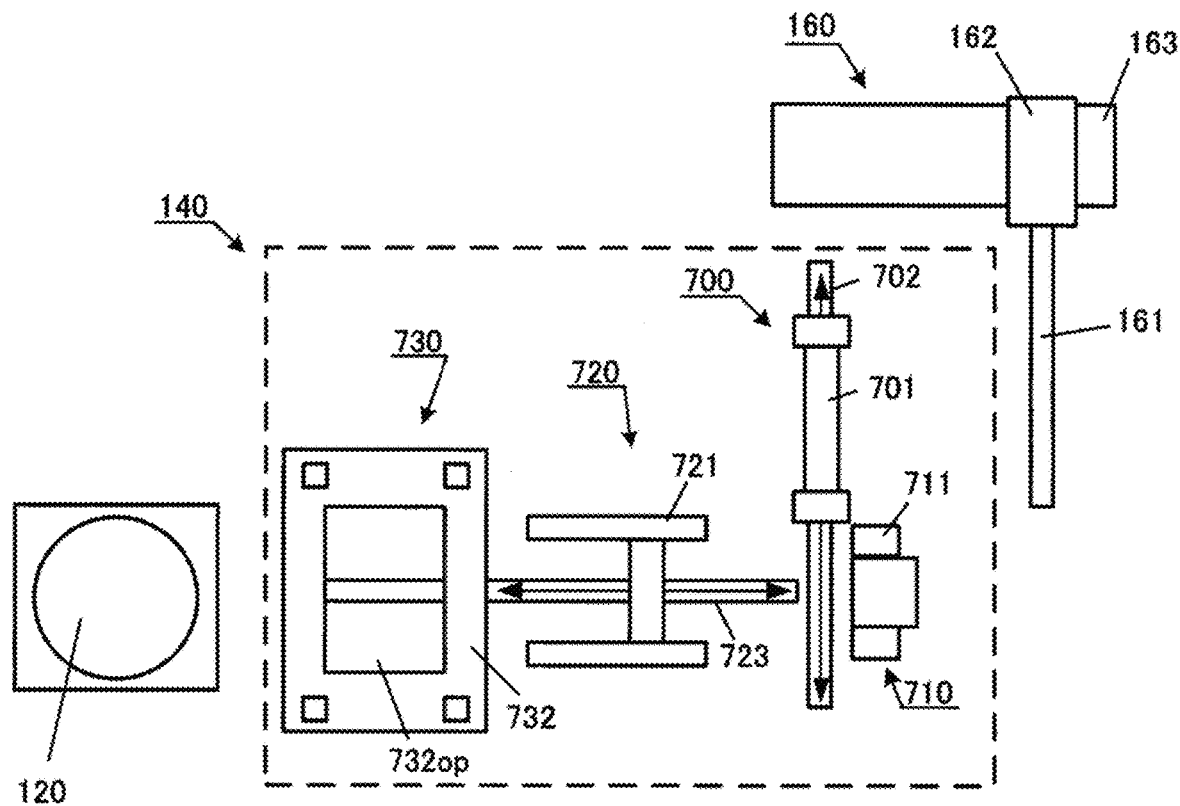
FIG. 7A is a top view of a substrate attachment and detachment device.
Figure 7B:
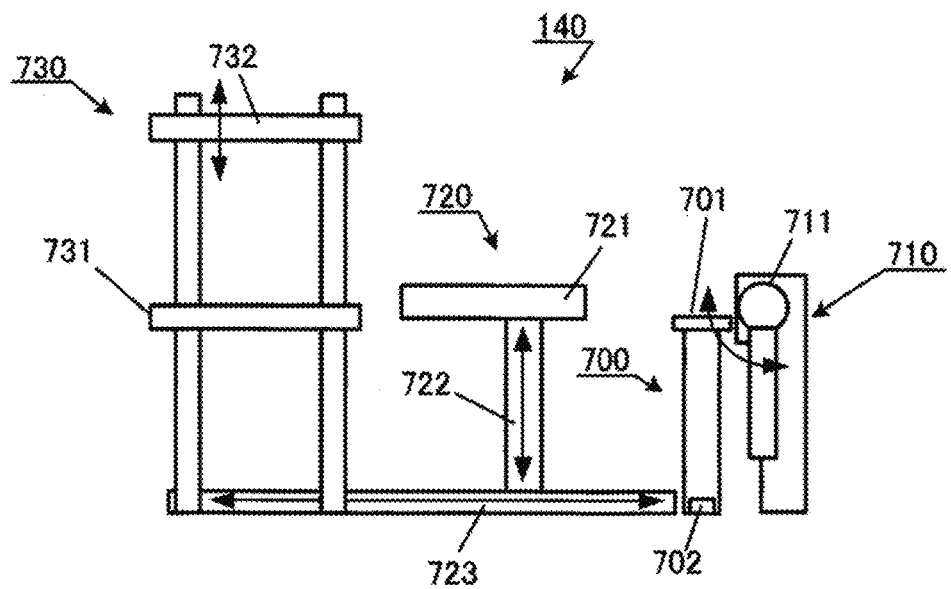
FIG. 7B is a side view of the substrate attachment and detachment device.

Details of the substrate attachment and detachment device 140 are described below. FIGS. 7A-7B are schematic diagrams of the substrate attachment and detachment device 140 of an embodiment. FIG. 7A is a top view of the substrate attachment and detachment device 140. FIG. 7B is a side view of the substrate attachment and detachment device 140. In FIG. 7A, the substrate transfer robot 120 and the transporter 160 are also illustrated in combination. The substrate attachment and detachment device 140 includes a holder reception portion 700, a holder tilting portion 710, a holder transfer portion 720, and a pressing portion 730. The transporter 160 is configured to be capable of accessing the holder reception portion 700. The substrate W is loaded on the substrate attachment and detachment device 140, more specifically on the pressing portion 730 by the substrate transfer robot 120.

The holder reception portion 700 includes a holder reception body 701 and a holder reception linear movement mechanism 702 for moving the holder reception body 701. The holder reception body 701 receives the substrate holder 200 from the transporter 160. After that, the holder reception body 701 can be moved close to the holder tilting portion 710 by the holder reception linear movement mechanism 702.

The holder tilting portion 710 includes a holder tilting portion arm 711. The holder tilting portion arm 711 receives the substrate holder 200 from the holder reception body 701. Due to the tilting of the holder tilting portion arm 711, the substrate holder 200 is tilted until being horizontal (the vertically directed substrate holder 200 becomes horizontally directed).

The holder transfer portion 720 includes a holder carrier 721, a carrier vertical movement mechanism 722 for vertically moving the holder carrier 721, and a transfer portion linear movement mechanism 723 for moving the carrier vertical movement mechanism 722 toward the pressing portion 730. The holder carrier 721 receives the substrate holder 200 from the holder tilting portion arm 711 and transfers the substrate holder 200 toward the pressing portion 730.

The pressing portion 730 includes a stage 731 on which the substrate holder 200 is placed horizontally and a pressing unit 732. The pressing unit 732 may have a pressing unit opening 732op for passing an upper substrate supporter 803 described later. The stage 731 is configured to receive the substrate holder 200 from the holder transfer portion 720. The stage 731 is further configured to deliver the substrate holder 200 to the holder transfer portion 720. The pressing unit 732 is disposed above the stage 731. The pressing unit 732 is configured to be capable of moving vertically. The pressing unit 732 can press the substrate holder 200 on the stage 731 downward. The substrate holder 200 is pressed by the pressing unit 732, and thereby the hook body 252 and the claw 271 are located at a position where the hook body 252 can be hooked to the claw 271 or the hooking between the hook body 252 and the claw 271 can be released.

It should be noted that the configuration of the substrate attachment and detachment device 140 that is shown is only an illustration. For example, the holder tilting portion 710 is not required as long as the substrate holder 200 can be made horizontal by the transporter 160. For example, elements other than the pressing portion 730 are not required as long as the transporter 160 can directly transport the substrate holder 200 to the pressing portion 730. The specific configuration of the substrate attachment and detachment device 140 may be determined appropriately. A so-called vertical pressing portion different from the pressing portion 730 of FIGS. 7A-7B and pressing the substrate holder 200 perpendicular to the ground may be used.

<Operations of Pressing Portion>

Figure 8A:
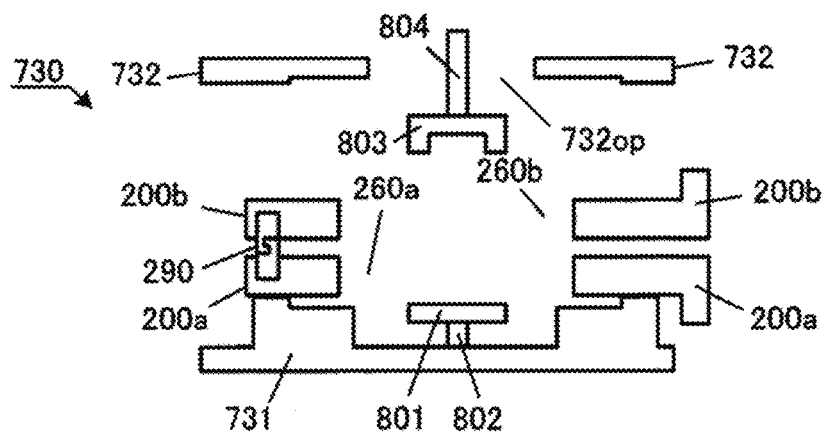
FIG. 8A is a first diagram showing operations of a pressing portion when the substrate is attached to the substrate holder.

FIGS. 8A-8F are used to describe operations of the pressing portion 730 when the substrate W is attached to the substrate holder 200. It should be noted that FIGS. 8A-8F merely indicates the basic principle of the operations of the pressing portion 730, and dimensions, shapes, arrangement and the like of the elements shown in FIGS. 8A-8F are not accurate. FIGS. 8A-8F are described in chronological order. Besides, when the substrate W is detached from the substrate holder 200, operations in an order reverse to the illustrated order are performed. In FIG. 8A, all components that are illustrated are added with symbols. On the other hand, only major components at that time are added with symbols in FIGS. 8B-8F. In addition, in the following description, the substrate holder 200 is placed on the stage 731 in the manner that the front frame 200a faces downward. However, the substrate holder 200 may also be placed on the stage 731 in the manner that the rear frame 200b faces downward.

As shown in FIGS. 8A-8F, the pressing portion 730 has a lower substrate supporter 801 and an upper substrate supporter 803 for sandwiching the substrate W between the front frame 200a and the rear frame 200b. The lower substrate supporter 801 can pass through the opening 260a to support the substrate W. The lower substrate supporter 801 is configured to be capable of moving vertically by a lower substrate supporter vertical movement mechanism 802. The upper substrate supporter 803 is configured to be capable of passing through the pressing unit opening 732op. The upper substrate supporter 803 can pass through the opening 260b to access the substrate W. The upper substrate supporter 803 is configured to be capable of moving vertically by the upper substrate supporter vertical movement mechanism 804. The substrate W is sandwiched and supported by the lower substrate supporter 801 and the upper substrate supporter 803.

The lower substrate supporter 801 and the upper substrate supporter 803 are directly in contact with the substrate W. Therefore, the lower substrate supporter 801 and the upper substrate supporter 803 are formed to only touch a contactable region of the substrate W. The contactable region of the substrate W is a region which is set in advance, for example, a region of the substrate W where wiring is not formed. Besides, the contactable region of the substrate W may be different depending on the substrate surface. The shape of the lower substrate supporter 801 may be the same as the shape of the upper substrate supporter 803, or the shape of the lower substrate supporter 801 and the shape of the upper substrate supporter 803 may be different. For example, the shape of the lower substrate supporter 801 may be a cross shape when viewed from above. For example, the shape of the upper substrate supporter 803 may be a reverse U-shape (a shape of two contact points with the substrate W) when viewed from the side.

<FIG. 8A> It is a diagram showing the pressing portion 730 at the time point when the substrate holder 200 not holding the substrate W is transferred into the stocker 170. In order not to inhibit the transferring of the substrate holder 200, the lower substrate supporter 801 is lowered, and the pressing unit 732 and the upper substrate supporter 803 are raised. When the clamper 290SL is used as the clamper 290, the substrate holder 200 may be semi-locked.

Figure 8B:
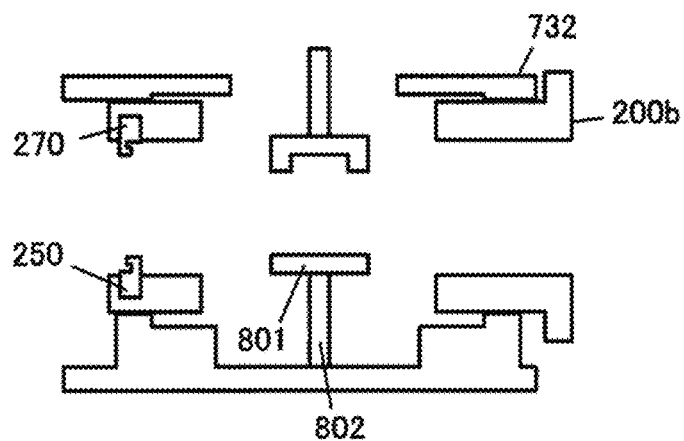
FIG. 8B is a second diagram showing the operations of the pressing portion when the substrate is attached to the substrate holder.

<FIG. 8B> Locking of the clamper 290 or semi-locking of the clamper 290SL is released. The release of the semi-locking of the clamper 290SL may be performed by any actuator (not shown) pushing the lever 254. The release of the locking of the clamper 290 may have a stage at which the pressing unit 732 or any actuator included in the pressing unit 732 presses the rear frame 200b toward the front frame 200a before a stage at which the lever 254 is pushed. After the locking or semi-locking is released, the pressing unit 732 lifts the rear frame 200b. The pressing unit 732 may have a hook or claw or the like (not shown) for lifting the rear frame 200b. The lower substrate supporter 801 is raised by the lower substrate supporter vertical movement mechanism 802 so that the lower substrate supporter 801 can receive the substrate W at the time point of FIG. 8C. However, when the substrate W is directly placed on the front frame 200a at the time point of FIG. 8C, raising of the lower substrate supporter 801 is not required.

Figure 8C:
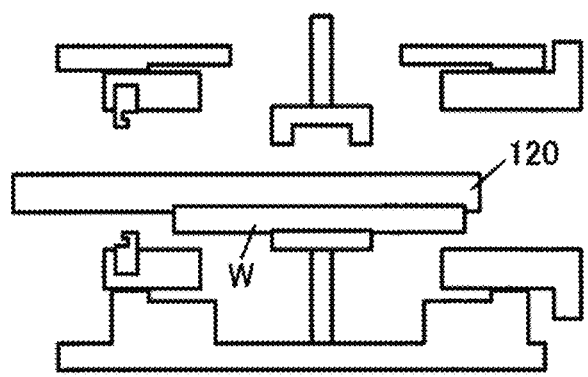
FIG. 8C is a third diagram showing the operations of the pressing portion when the substrate is attached to the substrate holder.

<FIG. 8C> The substrate W is placed at a prescribed position of the lower substrate supporter 801 by the substrate transfer robot 120. The substrate transfer robot 120 is configured not to interfere with the lower substrate supporter 801 and the upper substrate supporter 803 at the time point of FIG. 8D and FIG. 8E described later. At the time point of FIG. 8C, the substrate W may be directly placed on the front frame 200a.

Figure 8D:
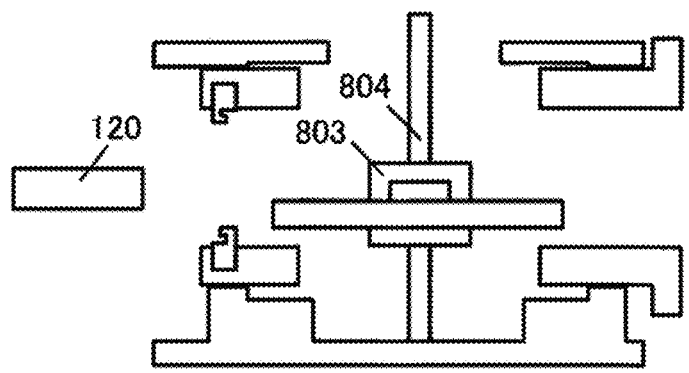
FIG. 8D is a fourth diagram showing the operations of the pressing portion when the substrate is attached to the substrate holder.

<FIG. 8D> The upper substrate supporter 803 is lowered by the upper substrate supporter vertical movement mechanism 804, and the substrate W is sandwiched by the lower substrate supporter 801 and the upper substrate supporter 803. After that, the substrate transfer robot 120 releases the substrate W, and the substrate transfer robot 120 is detached to the outside of the pressing portion 730.

Figure 8E:
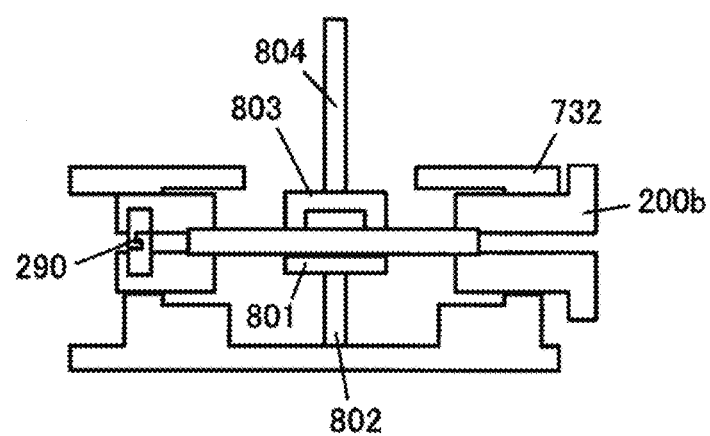
FIG. 8E is a fifth diagram showing the operations of the pressing portion when the substrate is attached to the substrate holder.

<FIG. 8E> In a state that the substrate W is sandwiched, the lower substrate supporter 801 and the upper substrate supporter 803 are lowered by the lower substrate supporter vertical movement mechanism 802 and the upper substrate supporter vertical movement mechanism 804. At the same time or after that, the pressing unit 732 is lowered, and the substrate W is sandwiched by the front frame 200a and the rear frame 200b. At the time point of FIG. 8E, the rear frame 200b is pressed toward the front frame 200a by any actuator and the like; furthermore, the clamper 290 is locked by another actuator and the like. At the time point of FIG. 8E, the front frame 200a may be pressed toward the rear frame 200b.

Figure 8F:
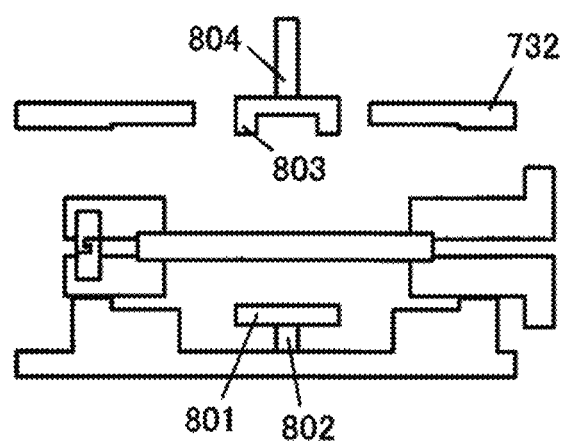
FIG. 8F is a sixth diagram showing the operations of the pressing portion when the substrate is attached to the substrate holder.

<FIG. 8F> An engagement between the pressing unit 732 and the rear frame 200b is released, and the pressing unit 732 is raised. At the same time, after that or before that, the lower substrate supporter 801 is lowered by the lower substrate supporter vertical movement mechanism 802, and the upper substrate supporter 803 is raised by the upper substrate supporter vertical movement mechanism 804. The substrate W is attached to the substrate holder 200 by the above operations. After FIG. 8F, the substrate holder 200 is unloaded from the pressing portion 730, and then from the substrate attachment and detachment device 140. As shown in FIG. 8F, when the dummy substrate 900 (see FIG. 9) is not held by the substrate holder 200, both surfaces of the substrate W held on the substrate holder 200 are exposed. Accordingly, when the dummy substrate 900 is not held, the substrate holder 200 becomes a holder for double-sided plating. Plating conditions of each surface of the substrate W can be changed by controlling the electric power supplied from each of the substrate electrodes 320.

<Substrate Holder Including Dummy Substrate>

Figure 9:
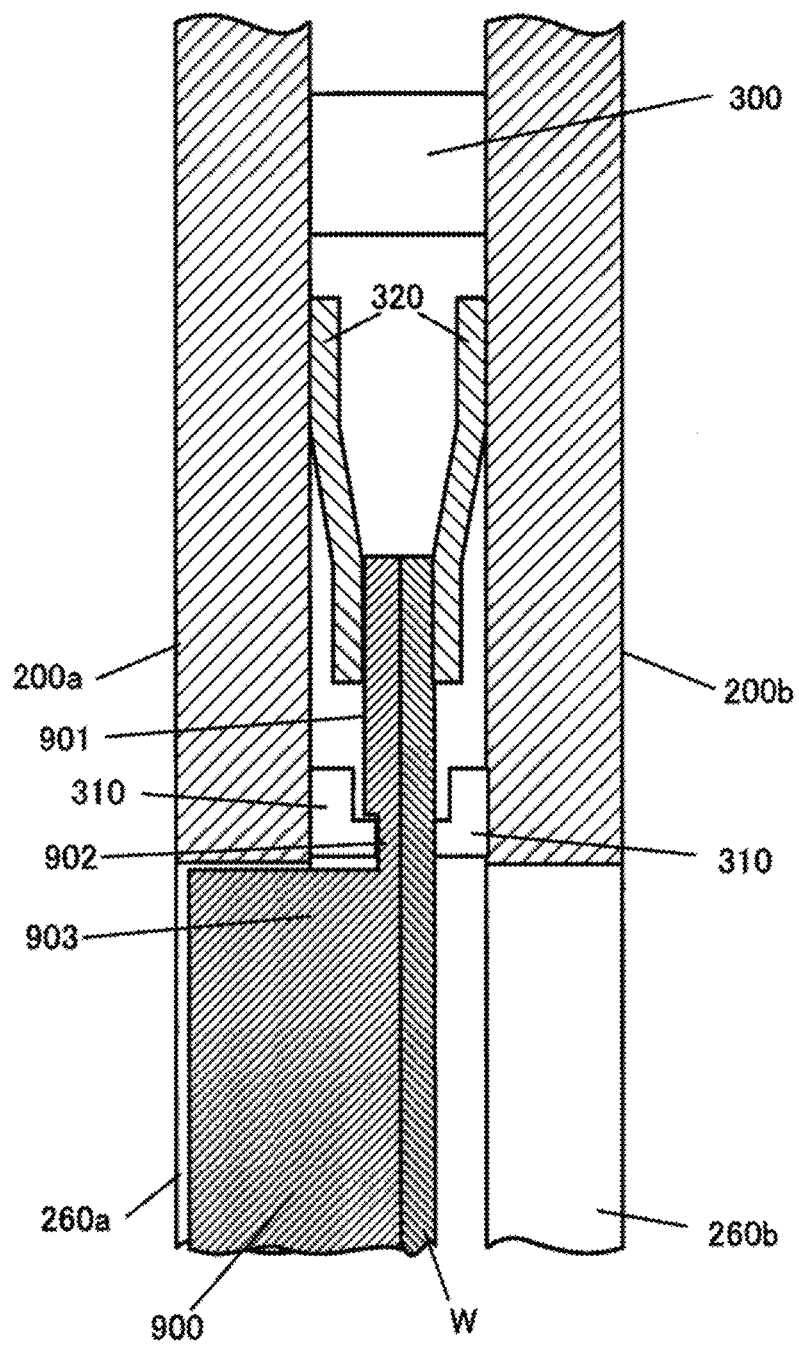
FIG. 9 is a cross-sectional view of the substrate holder including a dummy substrate.

Next, a structure and a method in a case of using the substrate holder 200 for single-side plating are described. FIG. 9 is a cross-sectional view of the substrate holder 200 including the dummy substrate 900. The substrate holder 200 of FIG. 9 is approximately the same as the substrate holder 200 of FIG. 3 except that the dummy substrate 900 is included. At least a part of the dummy substrate 900 is in contact with at least a part of any surface of the substrate W, for example, the surface facing the front frame 200a. The dummy substrate 900 is detachably arranged on the substrate holder 200.

One surface of the substrate W is covered by the dummy substrate 900. In other words, the dummy substrate 900 protects one surface of the substrate W from the plating solution. "Protecting the member from the plating solution" may be paraphrased as "shielding/separating/isolating the member from the plating solution" and the like. By attaching the dummy substrate 900 to the substrate holder 200, the substrate holder 200 can be used as a holder for single-side plating. The dummy substrate 900 is formed of a material that at least a direct current does not substantially flow therein, for example, an insulator or a dielectric material. When a direct current does not flow in the dummy substrate 900, the electric power supply from the substrate electrodes 320 touching the dummy substrate 900 may be continued or may be stopped. The dummy substrate 900 may be formed of polyvinyl chloride for example. By the dummy substrate 900 blocking the direct current from the substrate electrodes 320, formation of a plating layer on the dummy substrate 900 and disturbance of electrical conditions for the surface to be plated of the substrate W can be prevented. Basically, one surface of the substrate W covered by the dummy substrate 900 is not in contact with the plating solution. Accordingly, this surface of the substrate W can be prevented from being polluted by the plating solution.

The typical dummy substrate 900 has a first part 901 located in a region which is sealed by the outer seal 300 and the inner seals 310, a second part 902 in contact with the inner seals 310, and a third part 903 which is a part exposed via the opening 260a. The outermost edge portion of the dummy substrate 900 is the first part 901, the part disposed at the inner side of the first part 901 is the second part 902, and the part disposed at further inner side than the second part 902 is the third part 903. The first part 901, the second part 902, and the third part 903 are respectively different in thickness. However, the dummy substrate 900 (the dummy substrate 900 with uniform thickness) which is not divided into parts can also cover one surface of the substrate W. Accordingly, the shape of the dummy substrate 900 is not limited to the shape shown in FIG. 9.

The thickness of the second part 902 is thinner than the thickness of the first part 901 and the thickness of the third part 903. When the dummy substrate 900 is viewed from the direction of the front frame 200a, the dummy substrate 900 is configured so that a concave is formed in the part of the second part 902. The inner seal 310 is in contact with this concave part. A deformation amount of the inner seal 310 has a limit, and thus there is a possibility that a thick substrate W cannot be held when the second part 902 is thick. The thickness of the second part 902 may be thin so as to correspond to substrates W of various thicknesses. In one example, the thickness of the second part 902 is, for example, 0.1 mm or more and 2 mm or less. In another example, the thickness of the second part 902 is, for example, 0.2 mm or more and 1 mm or less. In still another example, the thickness of the second part 902 may be 0.5 mm. Strength of the second part 902 may be taken into account when determining the thickness of the second part 902.

The third part 903 prevents the dummy substrate 900 from falling off the substrate holder 200 when the substrate W is not held on the substrate holder 200, particularly when the substrate holder 200 is semi-locked. Furthermore, the third part 903 defines a position relationship between the substrate holder 200 and the dummy substrate 900. The size of the third part 903 in a plan view is slightly smaller than the size of the opening 260*a* in a plan view. The thickness of the third part 903 is determined so that at least a part of the third part 903 is inserted into the opening 260*a*. As one example, the third part 903 may be configured, for example, in a manner that a gap length between the third part 903 and the opening 260*a* is 0.5 mm. For example, the thickness of the third part 903 may be about 7 mm. The thickness of the third part 903 may be determined so that the third part 903 does not protrude from the front frame 200*a*. However, it should be noted that the specific size and thickness of the third part 903 may be different depending on various conditions.

Besides, when the substrate holder 200 holds the dummy substrate 900 in a semi-locking state, the distance between two inner seals is larger than the thickness of the second part 902 of the dummy substrate 900. In other words, when the substrate holder 200 is in the semi-locking state, the dummy substrate 900 presses neither of the inner seals 310 (however, the dummy substrate 900 may press one of the inner seals 310 due to gravity depending on the orientation of the substrate holder 200). In addition, the contact points (the substrate electrodes) of the substrate holder 200 are not in contact with the dummy substrate 900.

<Operations of Pressing Portion when Dummy Substrate is Used>

Figure 10A:
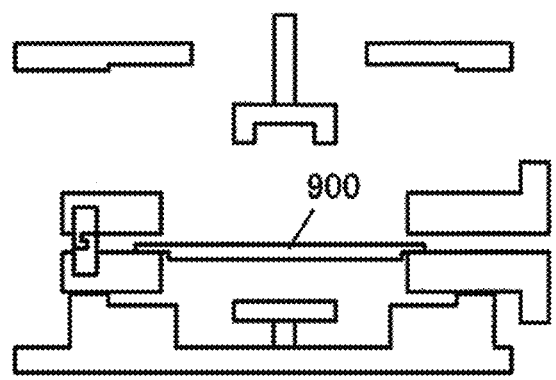
FIG. 10A is a first diagram showing operations of the pressing portion when the dummy substrate is used.
Figure 10B:
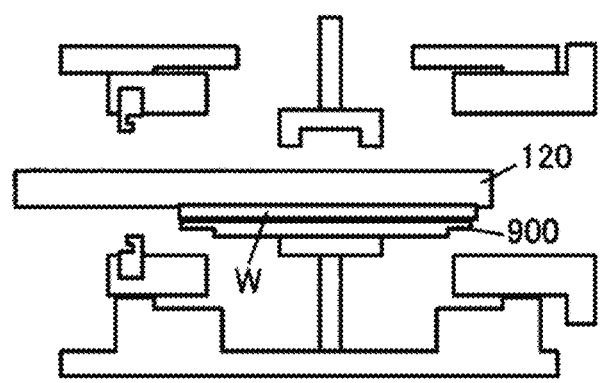
FIG. 10B is a second diagram showing the operations of the pressing portion when the dummy substrate is used.
Figure 10C:
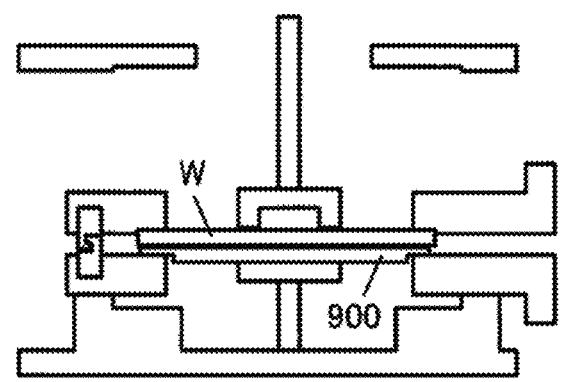
FIG. 10C is a third diagram showing the operations of the pressing portion when the dummy substrate is used.

FIG. 10 is used to describe operations of the pressing portion 730 when the dummy substrate 900 is used. FIG. 8A should be referred to for the components not added with symbols. FIGS. 10A-10C are described in chronological order. The dummy substrate 900 is held on the substrate holder 200 at the time point of FIG. 10A. The dummy substrate 900 may be held on the substrate holder 200 in a way similar to FIGS. 8A-8F if necessary. The dummy substrate 900 may also be held on the substrate holder 200 in advance manually or by other devices or the like. For example, the substrate holder 200 on which the dummy substrate 900 is held and the substrate holder 200 on which the dummy substrate 900 is not held may be respectively accommodated in the stocker 170, and each substrate holder 200 is used separately if necessary. Specifically, the substrate holder 200 including the dummy substrate 900 may be selected when single-side plating is performed, and the substrate holder 200 not including the dummy substrate 900 may be selected when double-side plating is performed. The substrate W is attached to the selected substrate holder 200. After that, the substrate held by this substrate holder 200 is subjected to plating.

Holding the dummy substrate 900 on several substrate holders 200 accommodated in the stocker 170 is advantageous in that a station for accommodating the dummy substrate 900, a transfer device for the dummy substrate 900 or an operation of transferring the dummy substrate 900 is not required. The substrate holder 200 on which the dummy substrate 900 is held is placed on the stage 731. When the clamper 290SL is used, the substrate holder 200 may be semi-locked at the time point of FIG. 10A.

From the time point of FIG. 10A to the time point of FIG. 10B, the following operations are performed. (1) The locking of the clamper 290 or the semi-locking of the clamper 290SL is released. If necessary, the semi-locking is released after the pressing unit 732 presses the rear frame 200*b* toward the front frame 200*a*. (2) The rear frame 200*b* is lifted up by the pressing unit 732. (3) The dummy substrate 900 is lifted up by the lower substrate supporter 801. (4) The substrate W is located above the dummy substrate 900 by the substrate transfer robot 120.

From the time point of FIG. 10B to the time point of FIG. 10C, the following operations are performed. (1) The upper substrate supporter 803 is lowered, and the substrate W and the dummy substrate 900 are sandwiched by the lower substrate supporter 801 and the upper substrate supporter 803. (2) The substrate transfer robot 120 is detached from the pressing portion 730. (3) The lower substrate supporter 801, the upper substrate supporter 803, and the pressing unit 732 are lowered, and both the substrate W and the dummy substrate 900 are sandwiched by the front frame 200*a* and the rear frame 200*b*. (4) The rear frame 200*b* is pressed toward the front frame 200*a*. (5) The clamper 290 is locked. (6) The engagement between the pressing unit 732 and the rear frame 200*b* is released, and the pressing unit 732 is raised.

After the time point of FIG. 10C, the lower substrate supporter 801 is lowered and the upper substrate supporter 803 is raised. After that, the substrate holder 200 on which both the substrate W and the dummy substrate 900 are held is unloaded from the pressing portion 730. When the substrate W is detached from the substrate holder 200 on which both the substrate W and the dummy substrate 900 are held, operations in an order reverse to the above-described order are performed. The dummy substrate 900 may be detached from the substrate holder 200 after the substrate W is detached. The substrate holder 200 on which the dummy substrate 900 is held may be returned to the stocker 170.

According to the above-described embodiments, a single substrate holder 200 can be used for both the single-side plating and the double-side plating only by selecting presence or absence of the dummy substrate 900. The shape of the substrate holder 200 is not significantly changed according to the presence or absence of the dummy substrate 900. Accordingly, it is unnecessary to significantly change the design of structural elements of the plating device 100 including the pressing portion 730 even when the substrate holder 200 of the embodiment is used.

<Holder/Dummy Substrate Cleaning Portion>

In addition, the plating device 100 may have a substrate holder cleaning tank which cleans the substrate holder 200 in the semi-locking state. The substrate holder cleaning tank can store a cleaning solution (for example, pure water) inside. During cleaning of the substrate holder 200, the substrate holder 200 in the semi-locking state is immersed in the cleaning solution. The substrate holder does not hold the substrate W in the semi-locking state, and thus the seals (for example, the outer seal 300 and/or the inner seals 310), the contact points (for example, the substrate electrodes 320) and the like are in contact with the cleaning solution and are cleaned. The cleaning solution in the substrate holder cleaning tank may be stirred by bubbling to improve the cleaning efficiency of the substrate holder 200. The substrate holder 200 may be cleaned by showering the cleaning solution toward a section to be washed of the substrate holder 200 instead of immersing the substrate holder 200 in the cleaning solution.

Ideally, the plating solution does not adhere to the surface of the dummy substrate 900 facing the substrate W. However, actually, due to various reasons such as liquid splashes during attachment or detachment of the dummy substrate 900 or the substrate W, scratches, vibrations, design errors, assembly errors, time-related deteriorations of each component, and the like, liquids such as the plating solution and the like may adhere to the surface of the dummy substrate 900 facing the substrate W. The substrate holder 200 in the semi-locking state on which the dummy substrate 900 is held may also be cleaned. Even when the plating solution adheres to the surface of the dummy substrate 900 facing the substrate W, the dummy substrate 900 can also be cleaned by cleaning the substrate holder 200 along with the dummy substrate 900. Besides, it may be that only the dummy substrate 900 held on the substrate holder 200 is cleaned. In the specification, the mechanism described above which cleans the substrate holder 200 and/or the dummy substrate 900 is referred to as a "holder/dummy substrate cleaning portion 190". Drying of the cleaned substrate holder 200 may be performed by pulling the substrate holder 200 up from the cleaning solution, or be performed by a blow tank which is arranged only for the drying of the substrate holder 200, or be performed by the blow tank 158.

<Surface of Dummy Substrate not Facing Substrate>

Figure 11A:
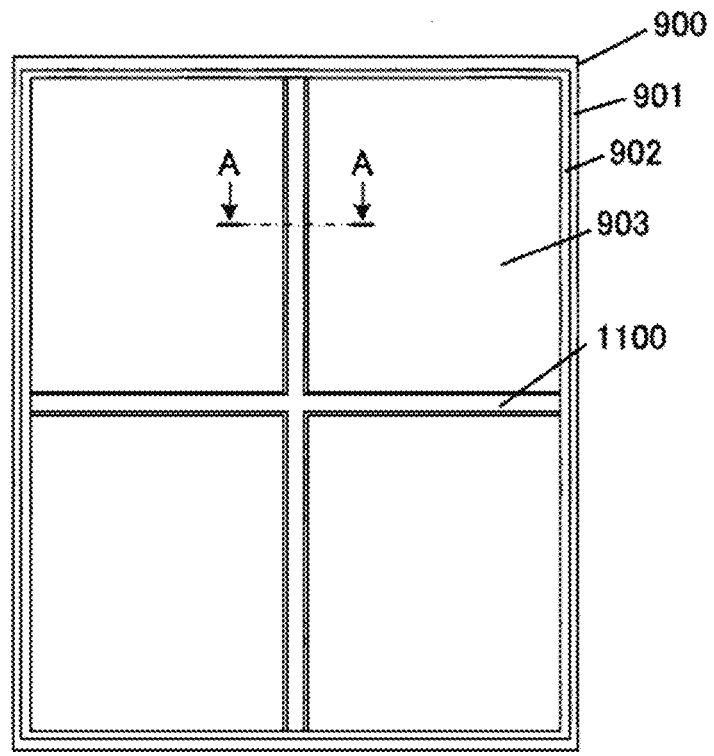
FIG. 11A is a diagram in which the dummy substrate is viewed from a surface not facing the substrate.
Figure 11B:
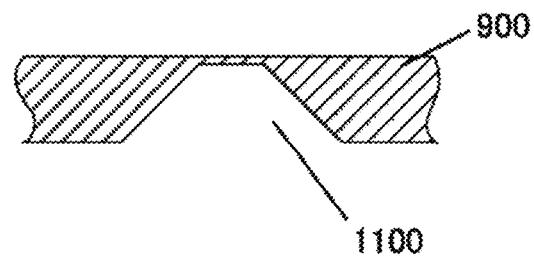
FIG. 11B is a cross-sectional view of an A-A position in FIG. 11A.

As is clear from FIGS. 10A-10C, a part of the surface of the dummy substrate 900 not facing the substrate W is in contact with the lower substrate supporter 801. Therefore, a concave portion 1100 corresponding to the shape of the lower substrate supporter 801 may be arranged on the surface of the dummy substrate 900 not facing the substrate W. FIG. 11A is a diagram in which the dummy substrate 900 is viewed from the surface not facing the substrate W. FIG. 11B is a cross-sectional view of a position marked with "A-A" in FIG. 11A. As described above, the lower substrate supporter 801 has a cross shape for example, and thus a cross-shaped concave portion 1100 is arranged in FIGS. 11A-11B. The concave portion 1100 is formed into a tapered groove shape. An inclination portion of the concave portion 1100 guides the lower substrate supporter 801 and thereby the lower substrate supporter 801 is reliably received by the concave portion 1100. Besides, the lower substrate supporter 801 can only move vertically; in contrast, the dummy substrate 900 can move horizontally in the range of not colliding with the opening 260a. Accordingly, to be accurate, it is the dummy substrate 900 itself that moves by the guidance of the concave portion 1100.

In addition, the thickness of the dummy substrate 900 at the bottom of the concave portion 1100 may coincide with the thickness of the second part 902. The thickness of the dummy substrate 900 at the bottom of the concave portion 1100 is made coincident with the second part 902, and thereby the height of a surface of the dummy substrate 900 touching the inner seals 310 and the height of a surface of the dummy substrate 900 touching the lower substrate supporter 801 can be made coincident.

<Surface of Dummy Substrate Facing Substrate>

Figure 12:
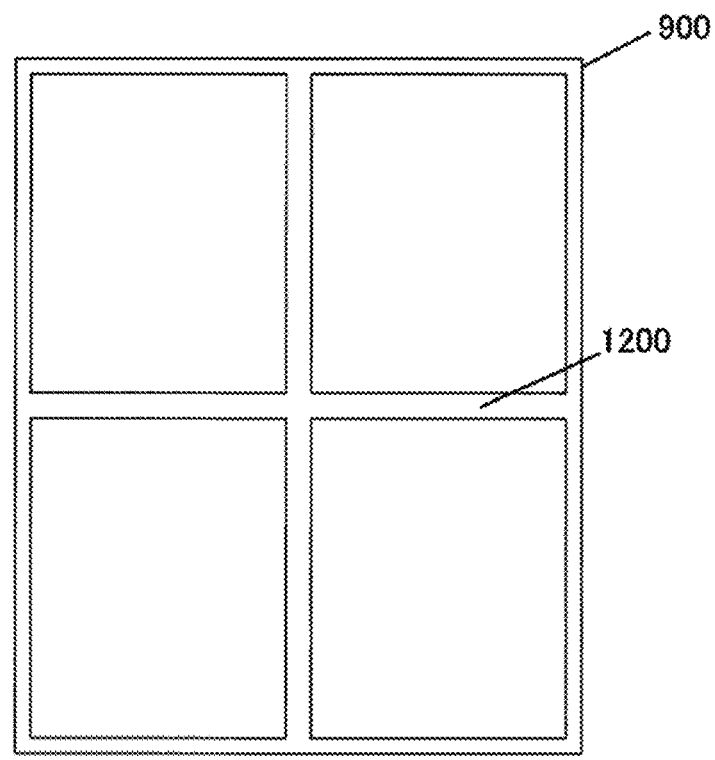
FIG. 12 is a diagram in which the dummy substrate is viewed from a surface facing the substrate.

The dummy substrate 900 of FIG. 9 is in surface contact with the substrate W. Accordingly, when a liquid (typically, the plating solution) enters the space between the dummy substrate 900 and the substrate W, the dummy substrate 900 may stick to the substrate W. The detachment of the substrate W may be difficult when the dummy substrate 900 sticks to the substrate W. In order to prevent the sticking between the dummy substrate 900 and the substrate W, it may reduce a contact area between the dummy substrate 900 and the substrate W as much as possible, and/or to secure a path for supplying gas (for example, the air) between the dummy substrate 900 and the substrate W during detachment of the substrate W. In addition, the contactable region of a non-plating surface of the substrate W may also be limited. Therefore, a protrusion portion 1200 may be arranged on the surface of the dummy substrate 900 facing the substrate W. FIG. 12 is a diagram in which the dummy substrate 900 is viewed from the surface facing the substrate W. The substrate W is in contact with the protrusion portion 1200 only instead of with the whole surface of the dummy substrate 900. In the example of FIG. 12, the protrusion portion 1200 has a cross shape. In addition, in the example of FIG. 12, an edge part of the dummy substrate 900 is also the protrusion portion 1200. By constituting the dummy substrate 900 as described above, the contact area between the dummy substrate 900 and the substrate W can be reduced and the supply path of gas can be secured, and the dummy substrate 900 can be prevented from sticking to the substrate W. In addition, by setting the shape of the protrusion portion 1200 to a shape similar to the contactable region of the substrate W, the contact between the dummy substrate 900 and the substrate W in parts other than the contactable region can be prevented.

Figure 13:
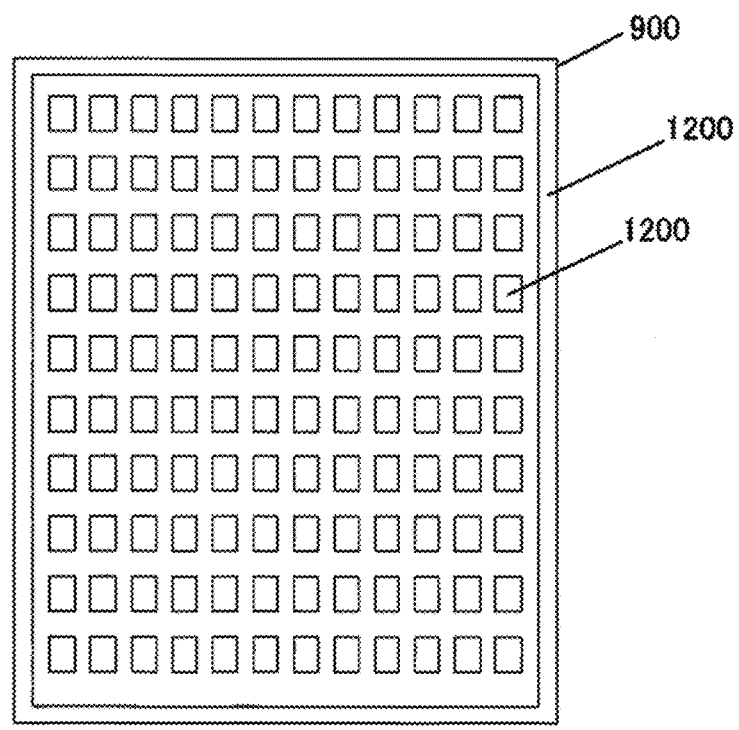
FIG. 13 is a diagram in which the dummy substrate is viewed from the surface facing the substrate.

When the dummy substrate 900 of FIG. 12 is used to plate a thin substrate W, the substrate W may deform due to water pressure of the plating solution. Therefore, the protrusion portions 1200 which are uniformly in contact with the substrate W over the whole surface of the dummy substrate 900 may be required. FIG. 13 is a diagram in which the dummy substrate 900 is viewed from the surface facing the substrate W. A plurality of protrusion portions 1200, 100 or more protrusion portions 1200 may be lined up on the surface of the dummy substrate 900 facing the substrate W in FIG. 13. In addition, the edge part of the dummy substrate 900 may also be the protrusion portion 1200. By constituting the dummy substrate 900 as shown in FIG. 13, the contact area between the dummy substrate 900 and the substrate W can also be reduced and the supply path of gas can also be secured, and the dummy substrate 900 can also be prevented from sticking to the substrate W. A distance between the protrusion portions 1200 of FIG. 13 is short, and thus the deformation amount of the substrate W caused by the water pressure can be reduced when the dummy substrate 900 of FIG. 13 is used. The specific number and size of the protrusion portions 1200 and the distance between the protrusion portions 1200 and the like may be determined appropriately. Besides, each of the protrusion portions 1200 is in contact with the substrate W on a plane, and thus the respective protrusion portions 1200 are the same in the height which is measured from the same reference plane. Whether to configure the protrusion portion 1200 as shown in FIG. 12 or as shown in FIG. 13 may be determined by the specific processes of plating, the size, thickness and material of the substrate W, the presence or absence of contactable region on the non-plating surface of the substrate W, and the like.

<Cut-Out of Dummy Substrate>

Figure 14:
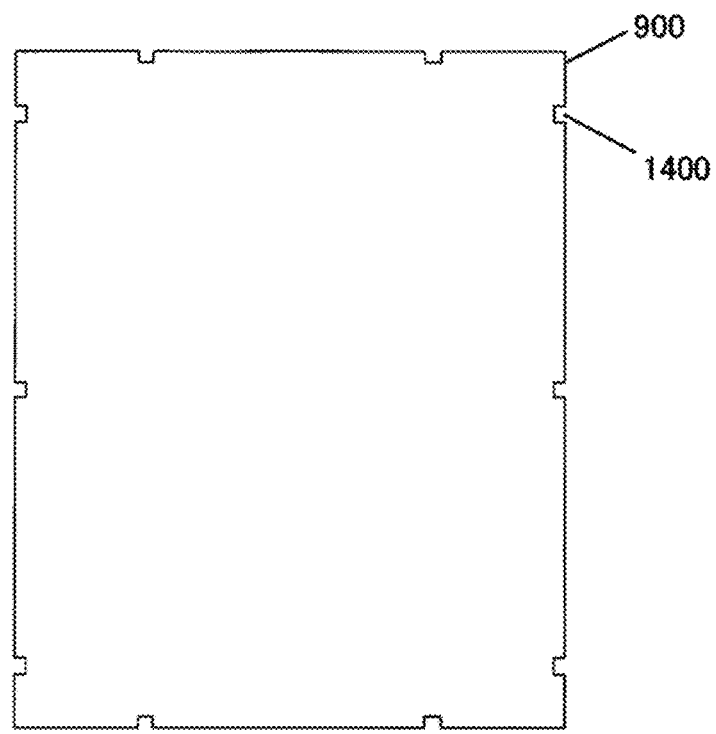
FIG. 14 is a diagram of the dummy substrate including cut-outs.

In order to take out the substrate from the substrate holder holding the substrate W and the dummy substrate 900 being in an overlapping state, it is considered to configure the substrate transfer robot 120 so that the substrate transfer robot 120 holds the substrate W from above by vacuum suction, or claws arranged on the substrate transfer robot 120 scoop up the outer peripheral portion of the substrate W from below. In the latter case, it is difficult to scoop up only the substrate W from below and lift up the substrate W as long as the substrate W and the dummy substrate 900 have the same shape. The reason is that the claws of the substrate transfer robot 120 may interfere with the dummy substrate 900. Therefore, cut-outs 1400 may be arranged on the outer peripheral portion of the dummy substrate 900. In FIG. 14, the dummy substrate 900 including ten cut-outs 1400 is shown. Three cut-outs 1400 are arranged on each long edge of the dummy substrate 900 of FIG. 14, and two cut-outs 1400 are arranged on each short edge. Besides, the "cut-out" is a term referring to a shape. In other words, an approach for forming the cut-outs 1400 is not limited to cutting. The cut-outs 1400 are arranged outside the position in contact with the inner seals 310. When the dummy substrate 900 is divided into the first part 901, the second part 902, and the third part 903 (see FIG. 9 for the division), the cut-outs 1400 are arranged in the first part 901. The cut-outs 1400 let the claws of the substrate transfer robot 120 pass through. Accordingly, the dummy substrate 900 is not scooped up with the substrate W.

Figure 18:
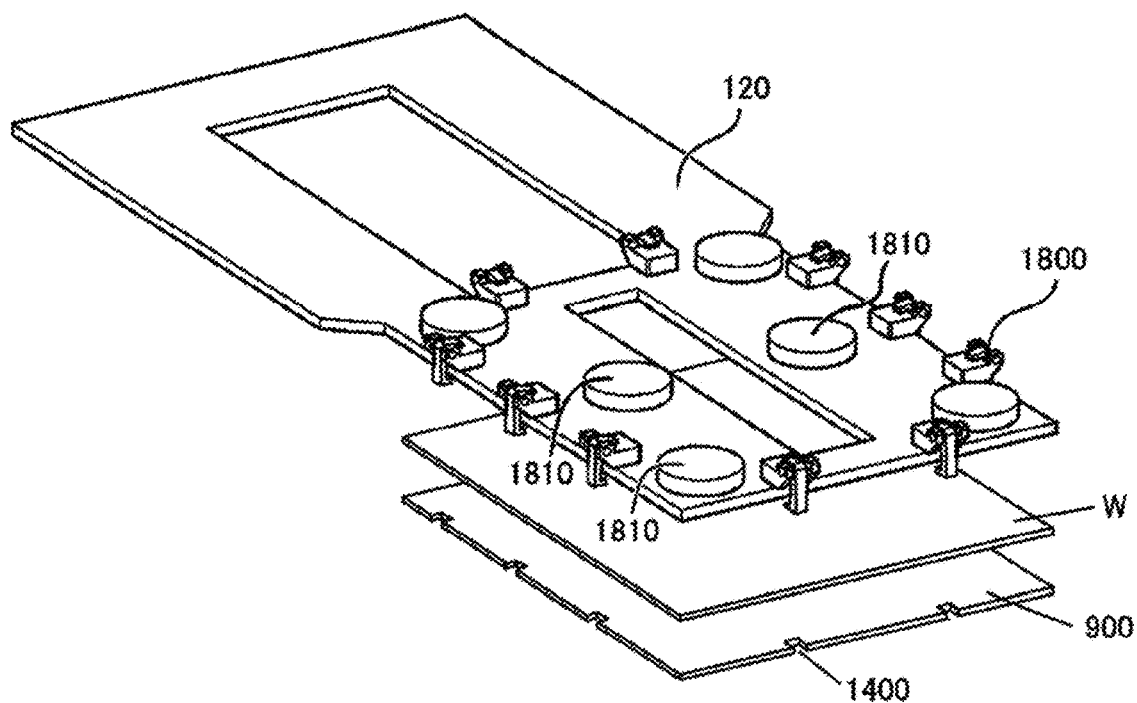
FIG. 18 is a perspective view showing a substrate transfer robot, the substrate, and the dummy substrate.
Figure 19:
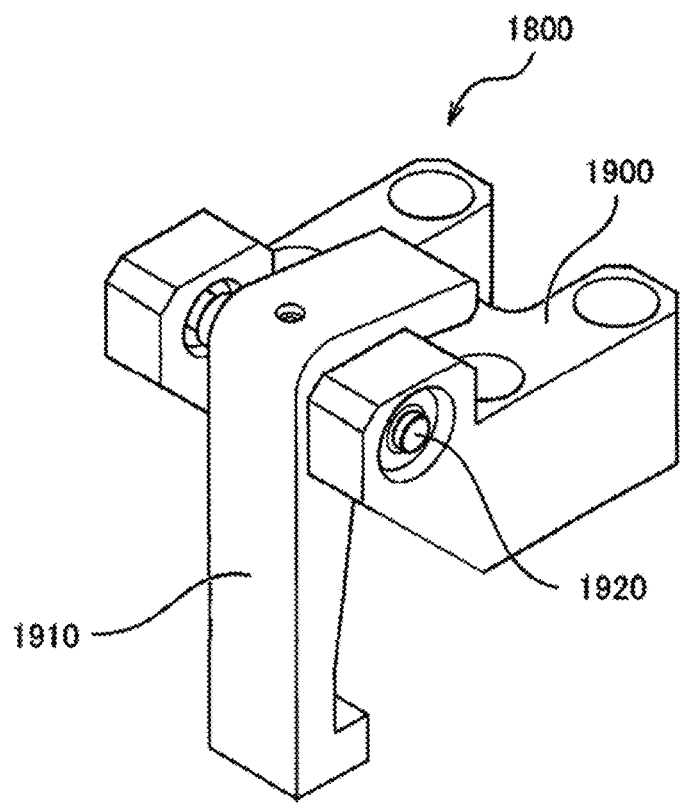
FIG. 19 is a perspective view of a claw of the substrate transfer robot.

FIG. 18 is used to further describe the cut-outs 1400. FIG. 18 is a perspective view showing the substrate transfer robot 120 (to be accurate, a robot hand which is a part of the substrate transfer robot 120), the substrate W, and the dummy substrate 900. The substrate W of FIG. 18 has a rectangular shape having long edges and short edges. The shapes of the substrate transfer robot 120 and the dummy substrate 900 are optimized for the rectangular substrate W. The substrate transfer robot 120 of FIG. 18 includes claws 1800 and substrate holding members 1810. The substrate holding members 1810 may be, for example, Bernoulli chucks for the suction of the substrate W. On the substrate transfer robot 120, two claws 1800 are arranged along one short edge of the substrate W and three claws 1800 are arranged along one long edge of the substrate W. FIG. 19 is a perspective view of the claw 1800. The claw 1800 may include an attachment portion 1900 for attaching the claw 1800 to the substrate transfer robot 120, a lever 1910 having a hook-shaped (claw-shaped) leading end, and a pin 1920. The lever 1910 is configured to be capable of pivoting. The pivoting of the lever 1910 may be electromagnetically controlled by a motor and the like, or be controlled by a combination of mechanical components such as a pin, a spring and the like. The lever 1910 is "open" in an initial state. In other words, in the initial state, the lever 1910 is made to pivot so that the leading end of the lever 1910 is located outside the substrate W. The leading end of the lever 1910 can support the lower surface of the substrate W due to the pivoting of the lever 1910.

The cut-outs 1400 are arranged on the dummy substrate 900 in a manner of corresponding to the position and number of the claw 1800, more specifically, corresponding to the position and number of the lever 1910. However, the "corresponding" here does not necessarily mean "the same". The specific shape of the cut-out 1400 is determined according to the shape of the lever 1910, particularly the shape of the leading end of the lever 1910. The leading end of the lever 1910 can access the substrate W due to the cut-out 1400, and the dummy substrate 900 is not scooped up with the substrate W.

Besides, the robot hand of the substrate transfer robot 120 is configured not to cause interference with the upper substrate supporter 803 and the like. For example, (the robot hand of) the substrate transfer robot 120 may have a groove and the like (not shown in FIG. 18) for passing the upper substrate supporter 803.

<Fixture for Fixing Dummy Substrate>

Figure 15:
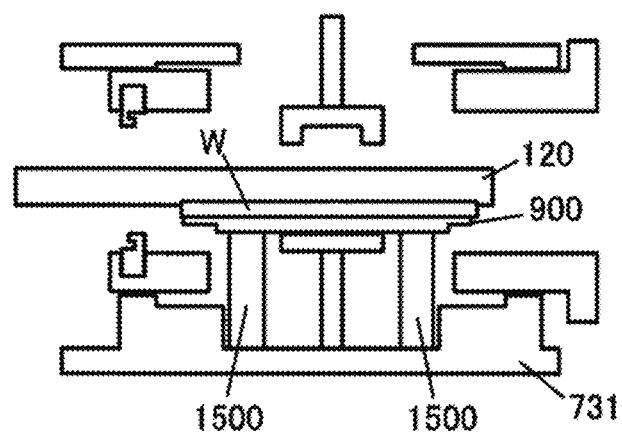
FIG. 15 is a diagram for illustrating a fixture.

As described above, there is a possibility that the dummy substrate 900 sticks to the substrate W when the dummy substrate 900 is used. In this case, if no force is applied to the dummy substrate 900 to fix the dummy substrate 900, it is difficult to separate the dummy substrate 900 and the substrate W. Therefore, the dummy substrate 900 may be fixed by a fixture 1500 when the substrate W is taken out. FIG. 15 is a diagram showing a fixation of the dummy substrate 900 using the fixture 1500. FIG. 8 should be referred to for the components not added with symbols in FIG. 15. The fixture 1500 is a vacuum chuck for example. One end of the fixture 1500 attracts the surface of the dummy substrate 900 not in contact with the substrate W to fix the dummy substrate 900. The other end of the fixture 1500 is coupled to another component, for example, the stage 731. The fixture 1500 fixes the dummy substrate 900 and thereby the substrate W is easily detached. The fixture 1500 may be an electromagnetic clamper, a mechanical fixture or the like besides the vacuum chuck. The fixture 1500 may be an element of the substrate holder 200 or an element of the pressing portion 730.

<Pressing Down Dummy Substrate by Actuator of Substrate Transfer Robot>

Figure 20:
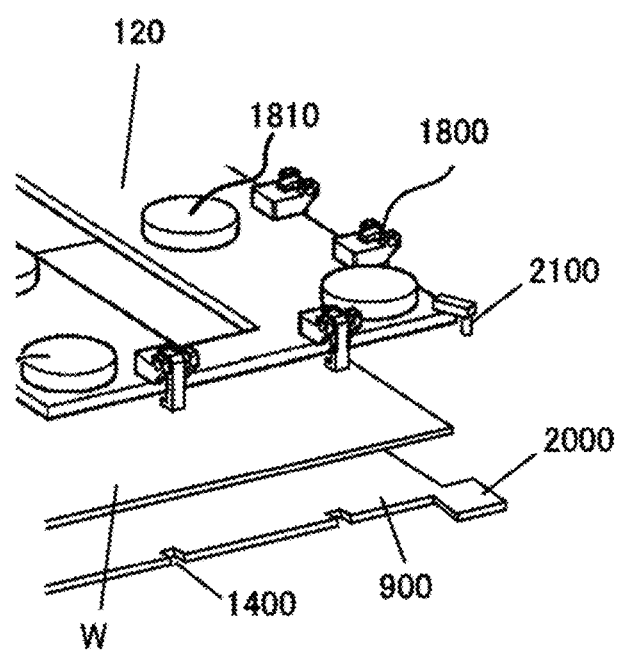
FIG. 20 is a perspective view of the substrate transfer robot having an actuator and the dummy substrate having an extension portion.

In place of the fixture 1500 or in addition to the fixture 1500, (the arm of) the substrate transfer robot 120 may have an actuator 2100 for pressing down the dummy substrate 900. FIG. 20 is a perspective view of the substrate transfer robot 120 having the actuator 2100 and the dummy substrate 900 having an extension portion 2000. The position and number of the extension portion 2000 correspond to the position and number of the actuator 2100. The "corresponding" here does not necessarily mean "the same". The extension portion 2000 and the actuator 2100 may be arranged near at least one of the corner portions of the substrate W. Moreover, the extension portion 2000 and the actuator 2100 may be arranged near all the corner portions of the substrate W (four corners of the substrate W if the substrate W is rectangular). The actuator 2100 is capable of moving vertically. The actuator 2100 may be a pneumatic mechanism or a mechanism that operates electromagnetically. The extension portion 2000 is configured to protrude from the substrate W. Accordingly, the actuator 2100 can also access the extension portion 2000 even when the substrate W is placed on the dummy substrate 900. In this example, the actuator 2100 presses the extension portion 2000 downward, and at the substrate transfer robot 120 lifts the substrate W up at the same time. By this operation, the substrate W is easily detached even when the dummy substrate 900 sticks to the substrate W. Besides, although not shown in FIG. 20, it should be noted that the dummy substrate 900 is supported from below by the lower substrate supporter 801 for example.

<Selection of Double-Side Plating and Single-Side Plating Using Frame Replacement>

Figure 16:
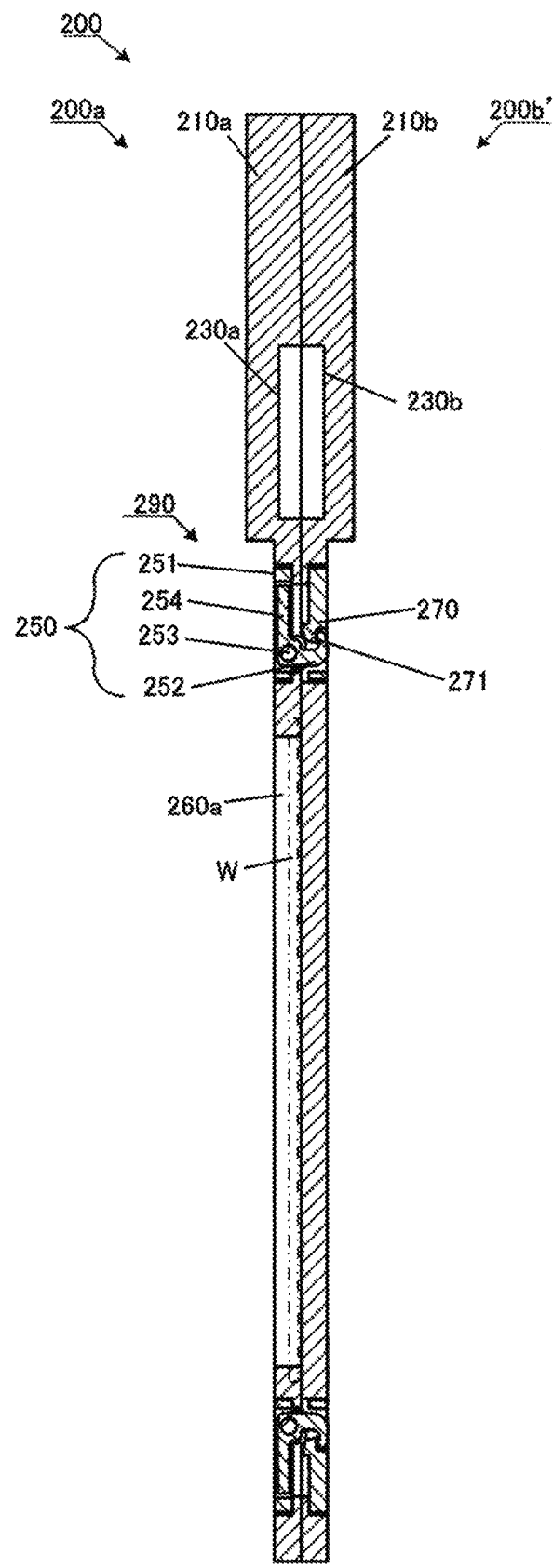
FIG. 16 is a cross-sectional view of the substrate holder including a rear frame without opening.

Different from the approaches described above, the substrate holder capable of both the double-side plating and the single-side plating can also be realized by replacing one of the front frame 200*a* and the rear frame 200*b* by a frame without opening. In FIG. 16, the rear frame 200*b* of FIG. 2B is replaced by a rear frame 200*b'* without the opening 260*b*. In this case, the opening 260*b* does not exist and thus one surface of the substrate W is not exposed. When the double-side plating is performed, the rear frame 200*b'* is replaced by the rear frame 200*b* again. Besides, in the specification, identity of the substrate holder 200 is not lost due to the replacement of the rear frame 200*b*. In addition, the frame for replacement may also be a front frame 200*a'*.

Figure 17:
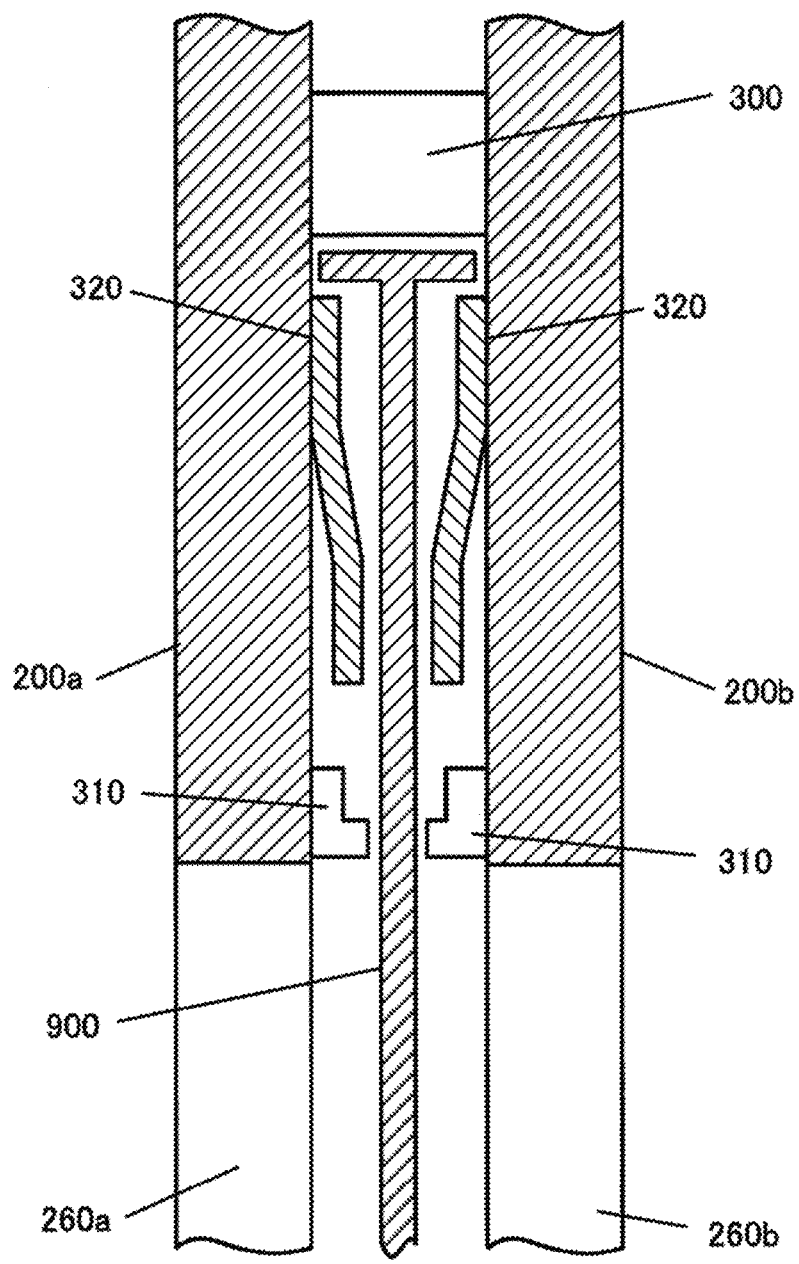
FIG. 17 is a cross-sectional view of a substrate holder 200 including a dummy substrate of another example.

In the example of FIG. 9, the dummy substrate 900 in the semi-locking state is prevented from falling off the substrate holder 200 by the third part 903. However, the shape of the dummy substrate 900 is not limited to the example shown in FIG. 9. FIG. 17 is a cross-sectional view of the substrate holder 200 including a dummy substrate 900 of another example. The dummy substrate 900 of FIG. 17 has a T-shaped cross section. A part corresponding to the "horizontal bar" of the T-shape, that is, a protrusion portion extending in a direction perpendicular to the surface of the dummy substrate 900 is disposed inside a region to be sealed by the outer seal 300 and the inner seals 310. The protrusion portion is caught on any member (for example, a hook-shaped member) inside the region to be sealed, and thereby the dummy substrate 900 in the semi-locking state is prevented from falling off. However, it should be noted that FIG. 17 is only an illustration and the shape of the dummy substrate 900 and/or the fall prevention method of the dummy substrate 900 may be determined appropriately.

Some embodiments of the disclosure are described above. However, the above embodiments are intended to facilitate the understanding of the disclosure and do not limit the disclosure. The disclosure can be altered and improved without departing from the gist, and the disclosure includes the equivalents thereof. In addition, in a scope where at least some of the above-described problems can be solved or a scope where at least some of the effects are exhibited, any combination or omission of constituent elements described in the claims and the specification can be made.

The application discloses, as an embodiment, a substrate holder for holding a substrate to be plated. The substrate holder includes a first frame having a first opening for exposing one surface of the substrate and a second frame having a second opening for exposing the other surface of the substrate, and the substrate is sandwiched between the first frame and the second frame. The substrate holder further includes a dummy substrate which is detachably disposed between the first frame and the substrate and is formed of a material that at least a direct current does not substantially flow therein. At least a part of the dummy substrate is in contact with at least a part of the one surface of the substrate. The dummy substrate protects the one surface of the substrate from a plating solution.

As an example, the substrate holder exhibits an effect that it can be used in both double-side plating and single-side plating by attachment and detachment of the dummy substrate.

The application further discloses, as an embodiment, a substrate holder in which each of the first frame and the second frame includes an inner seal in contact with the substrate or the dummy substrate. At least one of the first frame and the second frame includes an outer seal in contact with the other frame. The dummy substrate includes a first part which is an outer edge portion of the dummy substrate, a second part which is closer to an inner side of the dummy substrate than the first part and in contact with the inner seals, and a third part which is closer to the inner side than the second part. A thickness of the second part is thinner than the thickness of the first part or the thickness of the third part. In certain embodiment, the thickness of the second part is 0.1 mm or more and 2 mm or less.

As an example, the substrate holder exhibits an effect of holding substrates of various thicknesses.

The application further discloses, as an embodiment, a substrate holder in which cut-outs for passing claws of a transfer device for transferring the substrate are arranged in the first part.

As an example, the substrate holder exhibits an effect of preventing interference between the transfer device and the dummy substrate.

The application further discloses, as an embodiment, a substrate holder in which the third part is configured so that at least a part of the third part is inserted into the first opening.

As an example, the substrate holder exhibits an effect of preventing falling of the dummy substrate when the substrate is not held on the substrate holder, particularly when the substrate holder is semi-locked.

The application further discloses, as an embodiment, a substrate holder in which a protrusion portion is arranged on a surface of the dummy substrate facing the substrate, and the protrusion portion is in contact with the substrate. In certain embodiment, the protrusion portion is configured to be in contact with only a contactable region of the substrate.

As an example, the substrate holder exhibits an effect of preventing the dummy substrate from sticking to the substrate.

The application further discloses, as an embodiment, a plating device which includes substrate holders of any embodiment, a substrate attachment and detachment device for attaching the substrate to the substrate holder and detaching the substrate from the substrate holder, a treatment portion including at least one plating tank, a transporter for transporting the substrate holder, and a stocker for accommodating the substrate holder. In certain embodiment, at least one substrate holder including the dummy substrate and at least one substrate holder from which the dummy substrate is detached are accommodated in the stocker. In certain embodiment, the substrate holder includes a clamper capable of semi-locking the substrate holder, and at least one of the substrate holders is accommodated in the stocker in the state of being semi-locked.

As an example, the substrate holder exhibits an effect that both single-side plating and double-side plating can be performed by selecting the substrate holder to be used.

The application further discloses, as an embodiment, a substrate plating method for plating a substrate using a substrate holder. The substrate holder includes a first frame having a first opening for exposing one surface of the substrate, and a second frame having a second opening for exposing the other surface of the substrate. The substrate is sandwiched between the first frame and the second frame. The substrate holder is accommodated in a stocker of a plating device. At least one of the substrate holders accommodated in the stocker includes a dummy substrate which is disposed between the first frame and the substrate and formed of a material that at least a direct current does not substantially flow therein. At least a part of the dummy substrate is in contact with at least a part of the one surface of the substrate, and the dummy substrate protects the one surface of the substrate from a plating solution. At least another one of the substrate holders accommodated in the stocker does not include the dummy substrate. The method includes a selection step for selecting the substrate holder to be used, and in which the substrate holder including the dummy substrate is selected when single-side plating is performed and the substrate holder not including the dummy substrate is selected when double-side plating is performed; a step for attaching a substrate to the substrate holder selected in the selection step; and a step for performing plating on the substrate held by the substrate holder selected in the selection step.

As an example, the method exhibits an effect that both single-side plating and double-side plating can be performed by selecting the substrate holder to be used.

What is claimed is:

1. A substrate holder for holding a substrate to be plated, comprising:
    a first frame having a first opening for exposing one surface of the substrate; and
    a second frame having a second opening for exposing another surface of the substrate,
    wherein the substrate is sandwiched between the first frame and the second frame, and
    the substrate holder further comprises a dummy substrate which is detachably disposed between the first frame and the substrate, wherein the dummy substrate is formed of a material that at least a direct current does not substantially flow therein, at least a part of the dummy substrate is in contact with at least a part of the one surface of the substrate, and the dummy substrate protects the one surface of the substrate from a plating solution,
    wherein each of the first frame and the second frame comprises an inner seal in contact with the substrate or the dummy substrate,
    at least one of the first frame and the second frame comprises an outer seal in contact with the other frame,
    wherein the dummy substrate comprises:
    a first part which is an outer edge portion of the dummy substrate,
    a second part which is a part closer to an inner side of the dummy substrate than the first part and is in contact with the inner seal,
    a third part which is a part closer to the inner side than the second part, and
    a thickness of the second part is thinner than a thickness of the first part or a thickness of the third part.

2. The substrate holder according to claim 1, wherein the thickness of the second part is 0.1 mm or more and 2 mm or less.

3. The substrate holder according to claim 1, wherein cut-outs for passing claws of a transfer device for transferring the substrate are arranged in the first part.

4. The substrate holder according to claim 1, wherein the third part is configured so that at least a part of the third part is inserted into the first opening.

5. The substrate holder according to claim 1, wherein a protrusion portion is arranged on a surface of the dummy substrate facing the substrate, and the protrusion portion is in contact with the substrate.

6. The substrate holder according to claim 5, wherein the protrusion portion is configured to be in contact with only a contactable region of the substrate.

7. A plating device, comprising:
    the substrate holder according to claim 1;
    a substrate attachment and detachment device for attaching the substrate to the substrate holder and detaching the substrate from the substrate holder;
    a treatment portion comprising at least one plating tank;
    a transporter for transporting the substrate holder; and
    a stocker for accommodating the substrate holder.

8. The plating device according to claim 7,
    wherein at least one substrate holder comprising the dummy substrate and at least one substrate holder from which the dummy substrate is detached are accommodated in the stocker.

9. The plating device according to claim 7, wherein the substrate holder comprises a clamper capable of semi-locking the substrate holder, and
    the substrate holder is accommodated in the stocker in a state of being semi-locked.

10. The plating device according to claim 7,
    wherein each of the first frame and the second frame comprises an inner seal in contact with the substrate or the dummy substrate,
    at least one of the first frame and the second frame comprises an outer seal in contact with the other frame, and
    the dummy substrate comprises:
    a first part which is an outer edge portion of the dummy substrate,
    a second part which is a part closer to an inner side of the dummy substrate than the first part and is in contact with the inner seals,
    a third part which is a part closer to the inner side than the second part, and
    a thickness of the second part is thinner than a thickness of the first part or a thickness of the third part.

11. The plating device according to claim 10, wherein the thickness of the second part is 0.1 mm or more and 2 mm or less.

12. The plating device according to claim 10, wherein cut-outs for passing claws of a transfer device for transferring the substrate are arranged in the first part.

13. The plating device according to claim 7, wherein the dummy substrate comprises:
    a first part which is an outer edge portion of the dummy substrate,
    a second part which is a part closer to an inner side of the dummy substrate than the first part and is in contact with the inner seal,
    a third part which is a part closer to the inner side than the second part,
    a thickness of the second part is thinner than a thickness of the first part or a thickness of the third part, and
    the third part is configured so that at least a part of the third part is inserted into the first opening.

14. The plating device according to claim 7, wherein a protrusion portion is arranged on a surface of the dummy substrate facing the substrate, and the protrusion portion is in contact with the substrate.

15. The plating device according to claim 14, wherein the protrusion portion is configured to be in contact with only a contactable region of the substrate.

* * * * *